(12) United States Patent
Chen et al.

(10) Patent No.: US 9,640,771 B2
(45) Date of Patent: May 2, 2017

(54) NANOFIBER AND PHOTOVOLTAIC DEVICE COMPRISING PATTERNED NANOFIBER

(71) Applicant: National Taiwan University, Taipei (TW)

(72) Inventors: Wen-Chang Chen, Taipei (TW); Yu-Cheng Chiu, Taipei (TW); Jung-Yao Chen, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 14/604,109

(22) Filed: Jan. 23, 2015

(65) Prior Publication Data
US 2015/0263302 A1    Sep. 17, 2015

(30) Foreign Application Priority Data
Mar. 17, 2014  (TW) .............................. 103109874 A

(51) Int. Cl.
| | | |
|---|---|---|
| *H01L 51/44* | (2006.01) | |
| *H01L 51/42* | (2006.01) | |
| *H01L 31/054* | (2014.01) | |
| *H01L 51/00* | (2006.01) | |
| *H01L 27/30* | (2006.01) | |

(52) U.S. Cl.
CPC ........ *H01L 51/4253* (2013.01); *H01L 31/054* (2014.12); *H01L 27/304* (2013.01); *H01L 51/0036* (2013.01); *H01L 51/0037* (2013.01); *H01L 51/0047* (2013.01); *H01L 51/424* (2013.01); *H01L 51/442* (2013.01); *H01L 2251/308* (2013.01)

(58) Field of Classification Search
None
See application file for complete search history.

(56) References Cited

U.S. PATENT DOCUMENTS

| | | | | |
|---|---|---|---|---|
| 2006/0286684 A1* | 12/2006 | Brennan | .............. | B01J 13/0034 436/525 |
| 2008/0113214 A1* | 5/2008 | Davis | .................. | C09K 11/565 428/690 |
| 2012/0040581 A1* | 2/2012 | Kim | .................. | C04B 35/62218 442/330 |

(Continued)

OTHER PUBLICATIONS

Jin, et al., "Preparation of Polymer Nanofibers Containing Silver Nanoparticles by Using Poly(N-vinylpyrollidone)", Macromolecular Rapid Communications, vol. 26 (2005), pp. 1903-1907.*

(Continued)

*Primary Examiner* — Allison Bourke
*Assistant Examiner* — William E McClain
(74) *Attorney, Agent, or Firm* — Muncy, Geissler, Olds & Lowe, P.C.

(57) ABSTRACT

This invention provides a nanofiber, including: a core, which extends along the axis of the nanofiber, and its main component includes $Ag(NH_3)_2^+$ or $AgNO_3$; a shell, which extends along the nanofiber and coats the core of the nanofiber, and its main component of the shell structure includes: PVP, TBAP, SDS, grapheme, PMAA or PFBT nanoparticle. Moreover, the invention also provides a photovoltaic device which comprises the patterned nanofibers.

5 Claims, 20 Drawing Sheets

(56) References Cited

U.S. PATENT DOCUMENTS

| | | | | |
|---|---|---|---|---|
| 2013/0042911 A1* | 2/2013 | Jung | ............... | H01G 9/2031 |
| | | | | 136/256 |
| 2013/0295384 A1* | 11/2013 | Ma | ............... | B82Y 30/00 |
| | | | | 428/368 |
| 2014/0051013 A1* | 2/2014 | Elabd | ............... | H01M 4/8657 |
| | | | | 429/530 |

OTHER PUBLICATIONS

Kim, et al., "Plasmon enhanced performance of organic solar cells using electrodeposited Ag nanoparticles", Applied Physics Letters, vol. 93 (2008), 073307:1-3.*

He, et al., "Large-Scale Synthesis of Flexible Free-Standing SERS Substrates with High Sensitivity: Elecrospun PVA Nanofibers Embedded with Controlled Alignment of Silver Nanoparticles", ACS Nano, vol. 3 (2009), pp. 3993-4002.*

Park, et al., "Fabrications and Photovoltaic Properties of Dye-Sensitized Solar Cells with Electrospun Poly(vinyl alcohol) Nanofibers Containing Ag Nanoparticles", Macromol. Res. vol. 19 (2011), pp. 142-146.*

Kim, et al. "Silver nanowire embedded in P3HT: PCBM for high-efficiency hybrid photovoltaic device applications." ACS nano 5.4 (2011): 3319-3325.*

Choi, et al. "Multipositional silica-coated silver nanoparticles for high-performance polymer solar cells." Nano letters 13.5 (2013): 2204-2208.*

Chen et al., "Plasmon-Enhanced Polymer Photovoltaic Device Performance Using Different Patterned Ag/PVP Electrospun Nanofibers", Adv. Energy Mater, Jan. 27, 2014, 10 pages, vol. 4, Issue 8.

* cited by examiner

NANOFIBER AND PHOTOVOLTAIC DEVICE COMPRISING PATTERNED NANOFIBER

BACKGROUND OF THE INVENTION

1. Field of the Invention

The present invention relates to a nanofiber, especially to a nanofiber and a photovoltaic device comprising patterned nanofiber.

2. Description of the Related Art

Large-area solution processible organic photovoltaic (OPV) have attracted extensive scientific interest for renewable energy conversion due to the advantages of inexpensive, low fabrication temperature, and mechanical flexibility. Currently, the power conversion efficiency (PCE) of polymer-fullerene bulk-heterojunction OPVs over 9-10% are reported for single junction devices as well as tandem solar cells. However, with the comparatively low charge carrier mobility (usually less than $10^{-4}$ $cm^2V^{-1}s^{-1}$) of photo-active polymers, the quantum efficiency of OPV is relatively limited. Thus, it is common to use a thinner polymer film for preventing the exciton recombination, leading to higher internal quantum efficiency. The minimized photo-active layer, however, is required to harvest sufficient incident photons. Therefore, it remains a challenge using thin polymer films to create a more efficient light trapping and coupling environment for high performance OPV devices.

Light trapping method based on the surface plasmon resonance (SPR) effect was widely used to enhance OPV device performance recently. Metallic nanostructures such as Au, Ag, or Al were employed to improve OPV PCE in a range of 10-25% via the enhancement of localized surface plasmon resonance (LSPR) near field absorption. Also, several studies have reported that the LSPR from the metallic clusters would exhibit stronger local electrical field as compared to isolated particles due to the collective SPR with inter-particle plasmon coupling. In addition, Au—Ag alloy or silica-coated noble metal nanoparticles used in the photo-active layer resulted in a 14-30% improvement in PCE very recently. Especially, a silica shell layer of the metal/$SiO_2$ core/shell nanoparticles was enabled to act as an electrically insulating interface, which would not interfere with exciton generation and transport into the photo-active polymer layer. To further improve the electrical conductivity, besides, metallic nanoparticle assemblies formed supplemental charge transportation networks.

Electrospinning (ES) is a high-throughput processing technique to fabricate micro- or nanofibers from polymer solutions. The non-woven or well-aligned nanofibers prepared from semiconducting materials could be produced by the ES technique, and used for optoelectronic device (field-effect transistor, OPV, and memory) applications. The plasmonic nanoparticle-incorporated electrospun fibers enable unique one-dimensional metallic nanoparticle assemblies, which can introduce into the OPV system for light trapping. There has reported that Au and Ag nanoparticles were co-spun with polyethylene and poly(vinyl alcohol), respectively, with the encapsulated aggregates of plasmonic nanostructures. Indeed, Au nanorods were incorporated into poly(acryl amide) uniaxially-aligned ES fibers for waveguiding applications with photon-to-plasmon conversion efficiency of 70%. However, the applications of such nanofibers in bulk-heterojunction OPV devices have not been explored yet, as far as we know. In addition, the effect of the fiber architecture on the OPV performance is also not investigated.

SUMMARY OF THE INVENTION

To solve the above problem, the present invention aim to provide embodiments as follows.

One aspect of the present invention is to provide a nanofiber, comprising: a core, which extends along an axis of the nanofiber, and is mainly composed of $Ag(NH_3)_2^+$ or $AgNO_3$; and a shell, which extends along the axis of the nanofiber and wraps the core, and is mainly composed of at least one selected from the group consisting of PVP, TBAP, SDS, graphene, PMAA, PFBT, PFTP, and PFQ nanoparticle.

Preferably, the nanofiber has an average diameter of 200 to 1000 nm.

Preferably, the core is structured by Ag sphere having an average diameter of approximately 5 to 20 nm.

Preferably, the nanofiber is prepared by an electrospinning technique.

Preferably, the nanofiber is for use in a photovoltaic device.

Another aspect of the present invention is to provide a photovoltaic device comprising: a nanofiber layer, comprising the nanofiber of the present invention; an ITO layer, which is set under the nanofiber layer; a PEDOT:PSS layer, which is set above the nanofiber layer; a P3HT:$PC_{61}$BM layer, which is set above the PEDOT:PSS layer; and a Ca/Al layer, which is set above the P3HT:PC61BM layer.

Preferably, in the photovoltaic device, one or more nanofibers in the nanofiber layer is deposited in a substantially aligned-pattern.

Preferably, in the photovoltaic device, one or more nanofibers in the nanofiber layer has fused joints with each other.

Preferably, in the photovoltaic device, one or more nanofibers in the nanofiber layer is deposited in a non-woven pattern.

Preferably, in the photovoltaic device, one or more nanofibers in the nanofiber layer is deposited in a crossed-pattern.

According to the embodiments of the present invention, incorporating the nanofibers of the present invention into P3HT:PCBM OPV improves the charge drift velocity and further reduces the electrical resistance, particularly for the composite nanofibers with fused joints (i.e. non-woven and crossed-patterns). Additionally, the radiative energy transfer from excited plasmonic Ag/PVP electrospun nanofibers to the nearby active layer enhanced the exciton generation of P3HT. The P3HT:PC61BM OPV cell exhibited a PCE of 4.19% using the cross-patterned AgF-3, which was an 18.7% enhancement compared to the parent device with PCE of 3.53%.

DETAILED DESCRIPTION OF THE PREFERRED EMBODIMENTS

Figure 1:
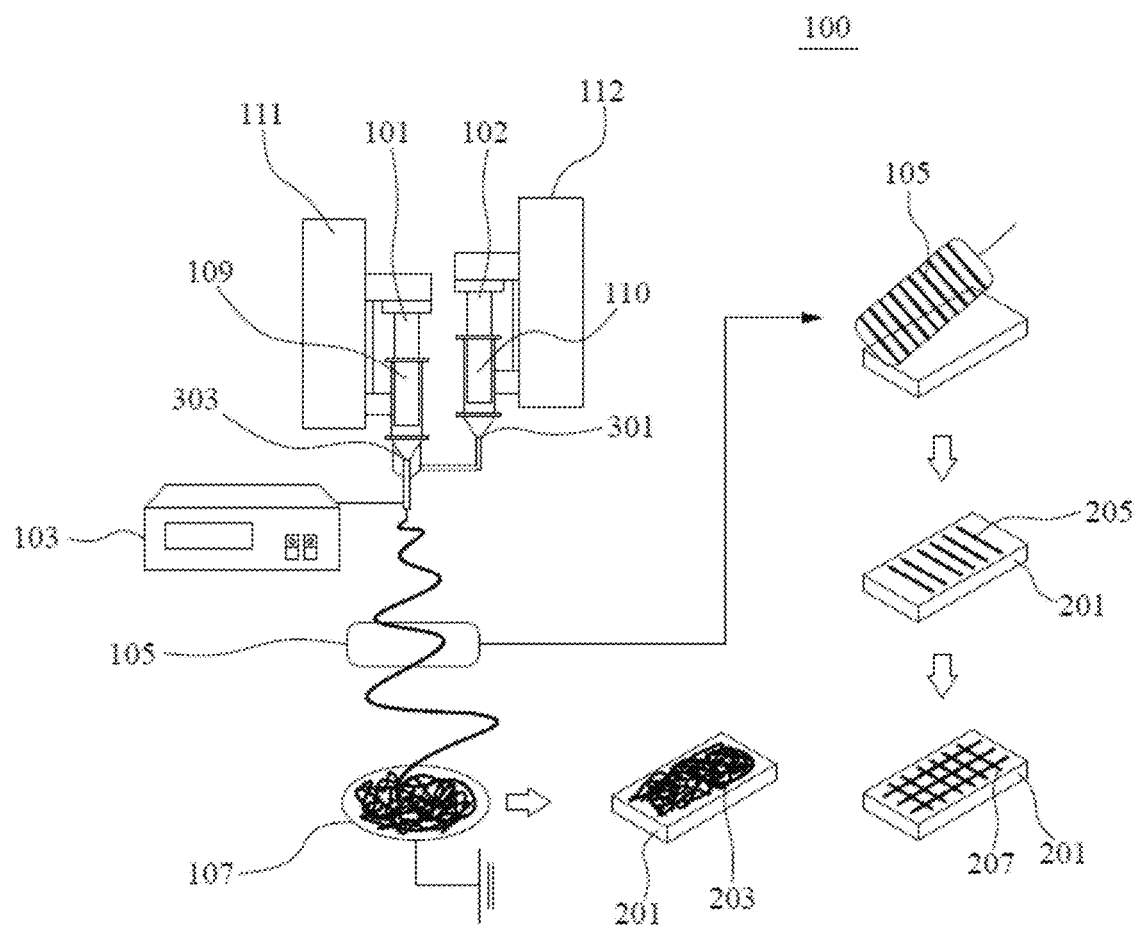
FIG. 1 Schematic representation of the coaxial electrospinning setup and the deposition method for non-woven, aligned- and crossed-patterns.

Hereinafter, illustrative embodiments and examples of the present disclosure will be described in detail with reference to the accompanying drawings so that inventive concept may be readily implemented by those skilled in the art.

The present invention provides a nanofiber, comprising a core, which extends along an axis of the nanofiber, and is mainly composed of $Ag(NH_3)_2^+$ or $AgNO_3$; and a shell, which extends along the axis of the nanofiber and wraps the core, and is mainly composed of at least one selected from the group consisting of PVP, TBAP, SDS, graphene, PMAA, PFBT, PFTP, and PFQ nanoparticle, wherein the size of the nanoparticles preferably ranges from 5 to 20 nm.

The nanofiber of the present invention is prepared by two-fluid coaxial electrospinning technique. Two syringes containing core and shell solutions were connected to a separate needle, and the needle was placed one inside the other to form a two-fluid coaxial ES system. The feed rate of the two syringes can be the same or different, for example, the feed rate of the core solution can be fixed between 0.1 to 0.5 ml h$^{-1}$ while the shell solution can be operated between 1.0 ml to 5.0 ml h$^{-1}$. The feed rate can be adjusted by the person skilled in the art according to the experiment.

The core solution, for example but is not limited to, $Ag_2O$ being added into ammonium hydroxide solution to form $Ag(NH_3)_2^+$ complex ion; or $AgNo_3$ being added into ethylene glycol. The PVP (Mw is about 1,000,000 to 2,000,000, preferably is 1,300,000) dissolved in methanol is used as shell solution. TBAP (Tetrabutylammonium Perchlorate) can be added to increase conductivity and then stabilize the cone-jet. Other shell solutions are PMMA(Poly(methacrylic acid)) and $PF_{99}BT_{01}$ (the number of the subscripts are the composition rate of the monomer, meaning 9,9-dioctylfluorene:2,1,3-benzothiadiazole=99:1) dissolved in 1:1 of DMF:$H_2O$, PFQ or PFTP nanoparticle, wherein the chemical formula of PFBT, PFQ or PFTP groups are as follows:

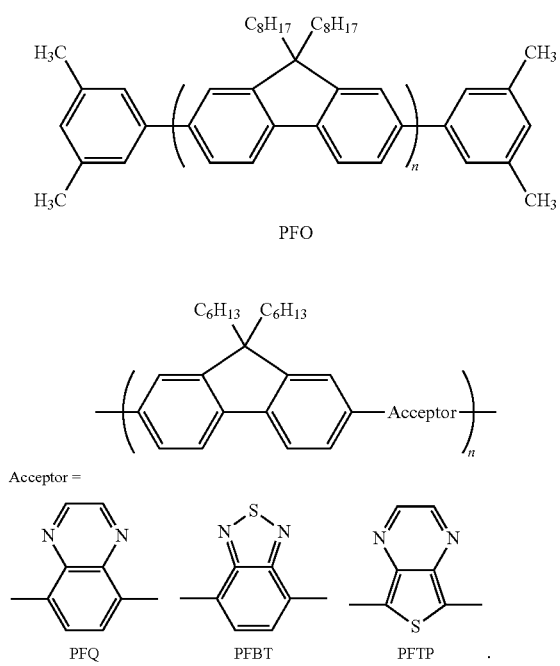

The average diameter of the nanofiber of the present invention is preferably ranges from 200 to 1000 nm, preferably 285 to 800 nm, more preferably 285 to 800 nm. The diameter of the nanofiber can be adjusted by controlling the concentration of the core solution and the shell solution. The core of the nanofiber of the present invention is structured by Ag sphere having an average diameter of approximately 5 to 20 nm, such as 5 nm, 10 nm, 15 nm, 16 nm and 20 nm etc.

The nanofiber of the present invention can be manufactured to form special patterns for the following usage. The pattern may be randomly distributed (also called non-woven in this invention), align-patterned (also called parallel aray in this invention), or cross-patterned. Preferably, the crossed pattern has better characteristics for further application (ex. photovoltaic device).

When the nanofiber of the present invention is applied in the photovoltaic devices, the photovoltaic devices comprises: a nanofiber layer made by the nanofiber of the present invention; an ITO layer which is set under the nanofiber layer; a PEDOT:PSS layer, which is set above the nanofiber layer; a P3HT:$PC_{61}BM$ layer, which is set above the PEDOT:PSS layer; and a Ca/Al layer, which is set above the P3HT:PC61BM layer. Preferably, the nanofiber layer is in cross-pattern.

Hereinafter, the present disclosure will be specifically described with reference to examples and drawings. However, the present disclosure is not limited to the examples and the drawings.

EXAMPLES

Example 1

Preparation of the Ag/PVP Composite Nanofibers (AgF-1)

FIG. 1 illustrates the coaxial Electrospinning (ES) devices and its use of manufacturing for non-woven, aligned, or crossed-pattern nanofiber layer. As FIG. 1 showed, the nanofiber and the photovoltaic devices containing the same can be prepared using the preparation procedures described in the following. Using two-fluid coaxial electrospinning technique, grounded modified collector 107 was employed to produce aligned core/shell nanofibers. Specifically, two syringes 101, 102 containing core and shell solutions 303, 301 respectively were connected to separate needles 109, 110, and the needle 109 was placed one inside the other to form a two-fluid coaxial ES system 100. The core and shell solutions 303, 301 were fed into the coaxial capillaries by two syringe pumps 111, 112 (KD Scientific Model 100, USA).

30 mg Silver oxide ($Ag_2O$, ≥99.99% trace metals basis) were added into ammonium hydroxide solution (ACS reagent, 28.0-30.0% NH3 basis) to form $Ag(NH_3)_2^+$ as core solution 303 of AgF-1. 200 mg $mL^{-1}$ of poly(vinyl pyrrolidone) (PVP) (Mw~1,300,000) dissolved in methanol (anhydrous, 99.8%) as the shell solution 301 of AgF-1. The feed rate of $Ag(NH_3)_2^+$ solution (core flow) was fixed at 0.1 ml $h^{-1}$ while the PVP solution (shell flow) was operated at 1.0 ml $h^{-1}$. The tip of the core needle was connected to a high-voltage power supply (chargemaster CH30P SIMCO, USA) 103. The spinning voltage was set at 14-15 kV and the working distance (the distance between tip of the needle 109, 110 and collector 107) was fixed at 13 cm. The stable cone-jet spinning mode in the ES process was monitored by CCD camera (XLi 3M USB2.0 CCD camera, USA) and Macro video zoom lens (OPTEM MVZL, USA) for obtaining uniform and aligned nanofibers. All ES experiments were carried out in air. Except the randomly oriented structures in the form of nonwoven mats (non-woven 203), the nanofibers can be stretched across the collector gap 105 (4 cm in length and gap width of 1 cm) to form a parallel array 205 and crossed pattern 207 by transferring two layers of uniaxially aligned composite nanofibers onto the same substrate 201, as shown in FIG. 1. The as-spun nanofibers were further annealed at 200° C. for 20 min to reduce Ag ion under the help of $NH_4OH$ where the nitrogen atom can provide unpaired electron. Subsequently, the Ag/PVP composite nanofibers were immersed in water for 1 h to etch the excess PVP and then dried at 80° C. under vacuum.

[Characterized the Morphology of the Nanofibers]

The morphology of the studied nanofibers was characterized by the following instruments: Field-emission scanning electron microscope (FE-SEM) images were taken using a microscope (JEOL JSM-6330F) operated at an accelerating voltage of 10 kV. Fluorescence optical microscope images were obtained by using two photon laser confocal microscopes (Confocal) (Leica LCS SP5). UV-Visible absorption spectra and steady-state photoluminescence (PL) spectra were recorded on a Hitachi U-4100 spectrophotometer and Horiba Fluorolog-3 spectrofluorometer (Jobin Yvon), respectively. Transmission electron microscope (TEM) images were taken by using a microscope (FEI Tecnai G2 20) operated at 200 keV to observe the distribution and crystallographic orientation of nanostructural Ag particles in Ag/PVP ES nanofibers. Atomic force micrographs were obtained with a Nanoscope 3D Controller AFM (Digital Instruments, Santa Barbara, Calif.) operated in the tapping mode at room temperature.

[Electrical Characterization of Ag/PVP Nanofibers]

To measure the two-terminal resistances of Ag/PVP ES nanofibers, aligned composite nanofibers were prepared from the above ES process and deposited on the silicon wafer with 200 nm-thick $SiO_2$ layer. Note that the wafer was first cleaned with toluene, acetone, and isopropyl alcohol, and then dried by $N_2$ steam. Top-contact electrodes were defined by 100 nm-thick of Au through a regular shadow mask with channel length 2.5 mm. The electrical conductivity of the nanofibers was calculated from the slope of the current (I)-voltage (V) curve by using Keithley 4200-SCS semiconductor parameter analyzer (Keithley Instruments Inc., Cleveland, Ohio, USA), with a remote PreAmp (4200-PA) in a $N_2$-filled glove box at room temperature. The scanning voltage was applied from −50 V to 50 V with the stepwise of 1 V.

Example 2

Preparation of the Ag/PVP Composite Nanofibers (AgF-2)

The example was prepared using the same preparation procedures as Example 1, except that 30 mg $Ag_2O$ was replaced by 5 mg $Ag_2O$ to add into 1 ml ammonium hydroxide solution to form $Ag(NH_3)_2^+$ complex ion as the core solution 303 of AgF-2. 100 mg $mL^{-1}$ of PVP dissolved in methanol as shell solution 301 of AgF-2 with 30 wt % of TBAP was added to increase conductivity and then stabilize the cone-jet. The same method as Example 1 was used to characterize the morphology and electrical property of the nanofibers.

Example 3

Preparation of the Ag/PVP Composite Nanofibers (AgF-3)

The example was prepared using the same preparation procedures as Example 1, except that 30 mg $Ag_2O$ was replaced by 1 mg $Ag_2O$ to add into 1 ml ammonium hydroxide solution to form $Ag(NH_3)_2^+$ complex ion as the core solution 303 of AgF-3. 100 mg $mL^{-1}$ of PVP dissolved in methanol as shell solution 301 in AgF-3 with 30 wt % of TBAP added to increase conductivity and then stabilize the cone-jet. The same method as Example 1 was used to characterize the morphology and electrical property of the nanofibers.

Example 4

Preparation of the $AgNO_3$/PMMA+$PF_{99}BT_{01}$ Composite Nanofibers (AgF-4)

The example was prepared using the same preparation procedures as Example 1, except that 30 mg $Ag_2O$ was replaced by 300 mg $AgNO_3$ to add into 1 ml ethylene glycol as the core solution 303 of AgF-4. 220 mg $mL^{-1}$ of PMAA dissolved in 1:1 $DMF:H_2O$ and the normal $PF_{99}BT_{01}$ particle with average diameter around 5 nm were used as shell solution 301. The same method as Example 1 was used to characterize the morphology and electrical property of the nanofibers.

Example 5

Preparation of the Ag/PVP+SDS+Graphene Composite Nanofibers (AgF-5)

The example was prepared using the same preparation procedures as Example 1, 1 mg/ml Ag(NH$_3$)$_2{}^+$ were used as the core solution 303 of AgF-5, 100 mg mL$^{-1}$ of PVP (Mw ~1,300,000), 30 mg/ml SDS (sodium dodecyl sulfate) and 3 mg/ml graphene dissolved in methanol (anhydrous, 99.8%) were used as shell solution 301 of AgF-5. The same method as Example 1 was used to characterize the morphology and electrical property of the nanofibers.

Example 6

Preparation of the Ag/PVP+SDS+Graphene Composite Nanofibers (AgF-6)

The example was prepared using the same preparation procedures as Example 1, 1 mg/ml Ag(NH$_3$)$_2{}^+$ were used as the core solution 303 of AgF-6, 100 mg/mL of PVP (Mw ~1,300,000), 30 mg/ml SDS (sodium dodecyl sulfate) and 6 mg/ml graphene dissolved in methanol (anhydrous, 99.8%) were used as shell solution 301 of AgF-6. The same method as Example 1 was used to characterize the morphology and electrical property of the nanofibers.

Comparative Example 1

PVP ES Nanofiber

The example was prepared using the same preparation procedures as Example 1, except that 30 mg ml$^{-1}$ of the core solution Ag$_2$O was removed in the preparation procedure of PVP-ES nanofiber.

Example 7

Preparation of the P3HT/PCBM Photovoltaic Device using the ES Composite Nanofibers All the bulk-heterojunction photovoltaic cells were prepared using the same preparation procedures and device fabrication procedure, described in the following. The glass-indium tin oxide (ITO) substrates (obtained from Luminescence Technology Corp., Taiwan, 7 Ωsq-1) were first patterned by lithograph, then cleaned with detergent, and ultrasonicated in acetone and isopropyl alcohol, then subsequently dried on a hot plate at 120° C. for 5 min. Ag/PVP ES nanofibers from examples 1 to 6 were deposited on ITO substrates respectively with the rectangular metal gap, preparing non-woven, align-, or cross-patterned ES nanofibers. Poly(3,4-ethylenedioxy-thiophene):poly(styrene-sulfonate) (PEDOT:PSS, Baytron P VP AI4083) passed through a 0.45 μm filter and then spin-coated at 3500-5000 rpm on ITO/nanofibers and dried at 140° C. for 20 min under ambient environment. The active layer of the P3HT:PC61BM blend (1:0.8, w/w) in anhydrous DCB (17.5 mg ml-1) was followed by spin-coating at 1000 rpm on top of the PEDOT:PSS layer. These as-cast films were kept in petri dish to control the drying rate under nitrogen atmosphere. After that, the device was annealed at 140° C. for 10 min in a N$_2$-filled glove box. Subsequently, the device was deposited Ca (30 nm) and Al (100 nm) by thermal evaporation of under high vacuum (<10$^{-6}$ torr) with the active area of 4 mm$^2$. The current density (J)-voltage (V) measurement of the photovoltaic devices was conducted by a computer-controlled Keithley 2400 (Keithley Instruments Inc., Cleveland, Ohio, USA) source measurement unit (SMU) with a Peccell solar simulator under the illumination of AM 1.5 G, 100 mW cm$^{-2}$. The illumination intensity was calibrated by a standard Si photodiode detector with KG-5 filter. In addition, the external quantum efficiencies (EQEs) were measured by using a Xe lamp in combination with a monochromator (Oriel Inc., USA).

Comparative Example 2

P3HT/PCBM Photovoltaic Devices with no ES Composite Nanofiber

Using the same preparation of Example 7 to produce P3HT/PCBM photovoltaic devices, except that the step of AgF1 to AgF6 nanofibers deposited on ITO substrates with the rectangular metal gap was omitted to prepare P3HT/PCBM photovoltaic devices with no nanofiber of AgF1 to AgF6.

Comparative Example 3

PF$_{99}$BT$_{01}$/PMAA ES Nanofiber

The example was prepared using the same preparation procedures as Example 4, except that 30 mg ml$^{-1}$ of the core solution AgNO$_3$ dissolved in ethylene glycol was replaced by ethylene glycol as a core solution 303 of PF99BT01/PMAAES nanofiber.

Result

With the merit of the ES technique, we can facilely prepare various architectures of Ag/PVP nanofibers, as schematically illustrated in FIG. 1. Six types of composite nanofibers, AgF-1 to AgF-6, were fabricated via a coaxial ES technique for manipulating nanostructure and electrical conductivity, consisting of Ag(NH$_3$)$_2{}^+$ complex ion core or AgNO$_3$ core and PVP shell or PVP shell adding graphene, PMAA and/or PF$_{99}$BT$_{01}$. The morphology of Ag/PVP composite nanofibers were characterized using both FE-SEM and TEM.

Figure 2:
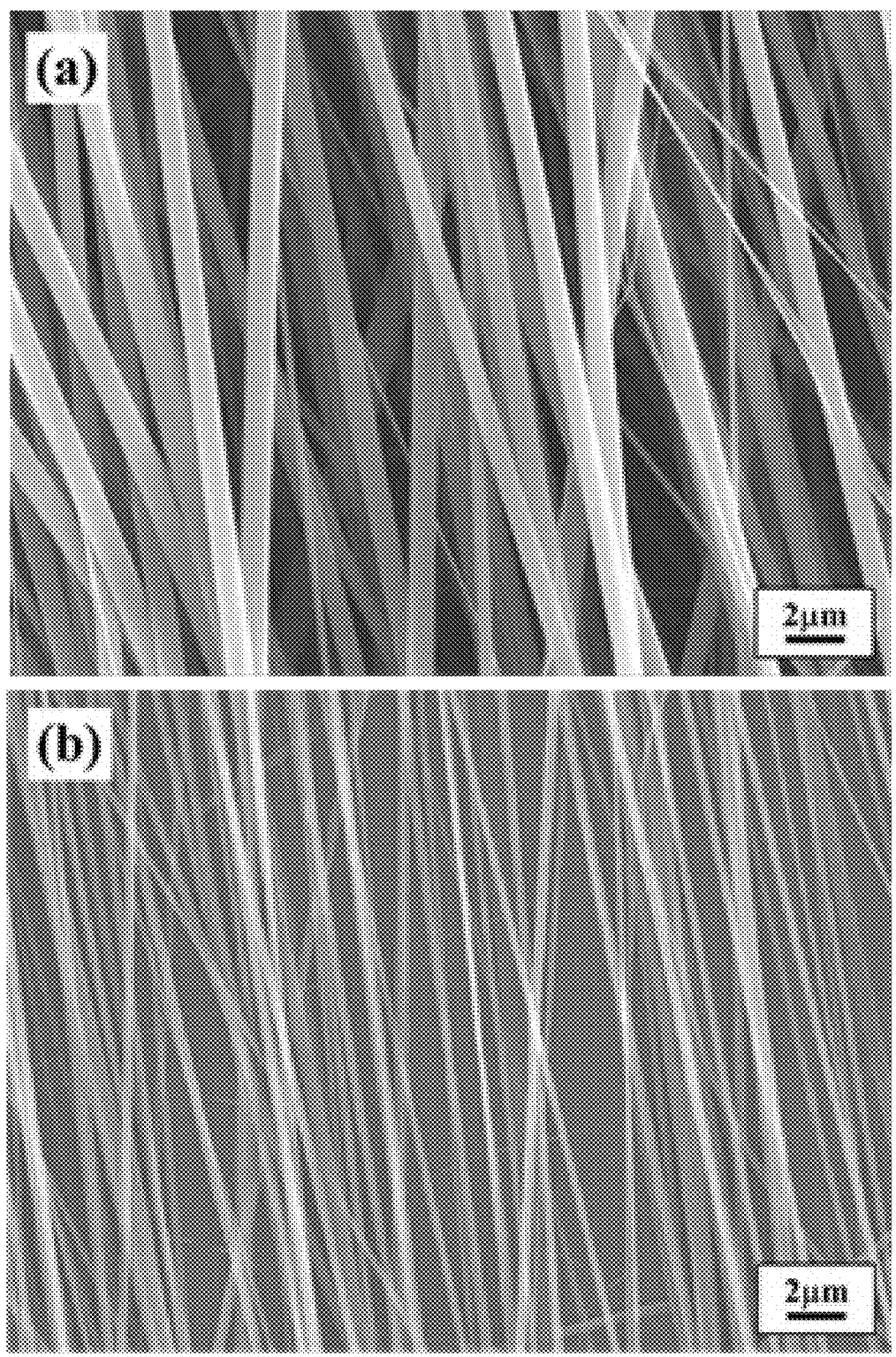
FIG. 2 Field-emission scanning electron microscope (FE-SEM) images of as-spun aligned nanofibers of (a) AgF-1, (b) AgF-2 and (c) AgF-3; (d) AgF-1, (e) AgF-2 and (f) AgF-3 after vacuum calcinations at 400° C. for 2 h.
Figure 2:
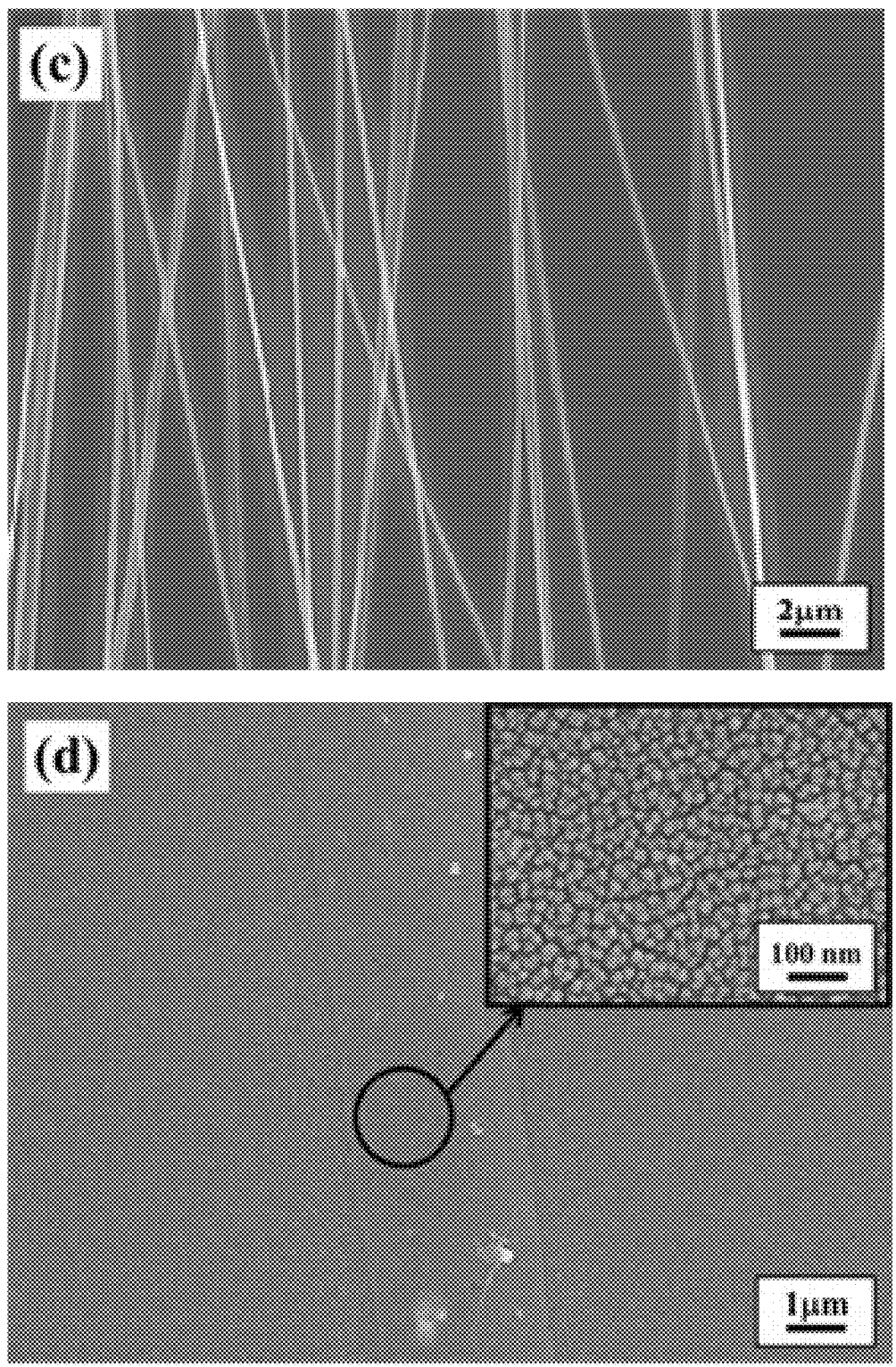
Figure 2:
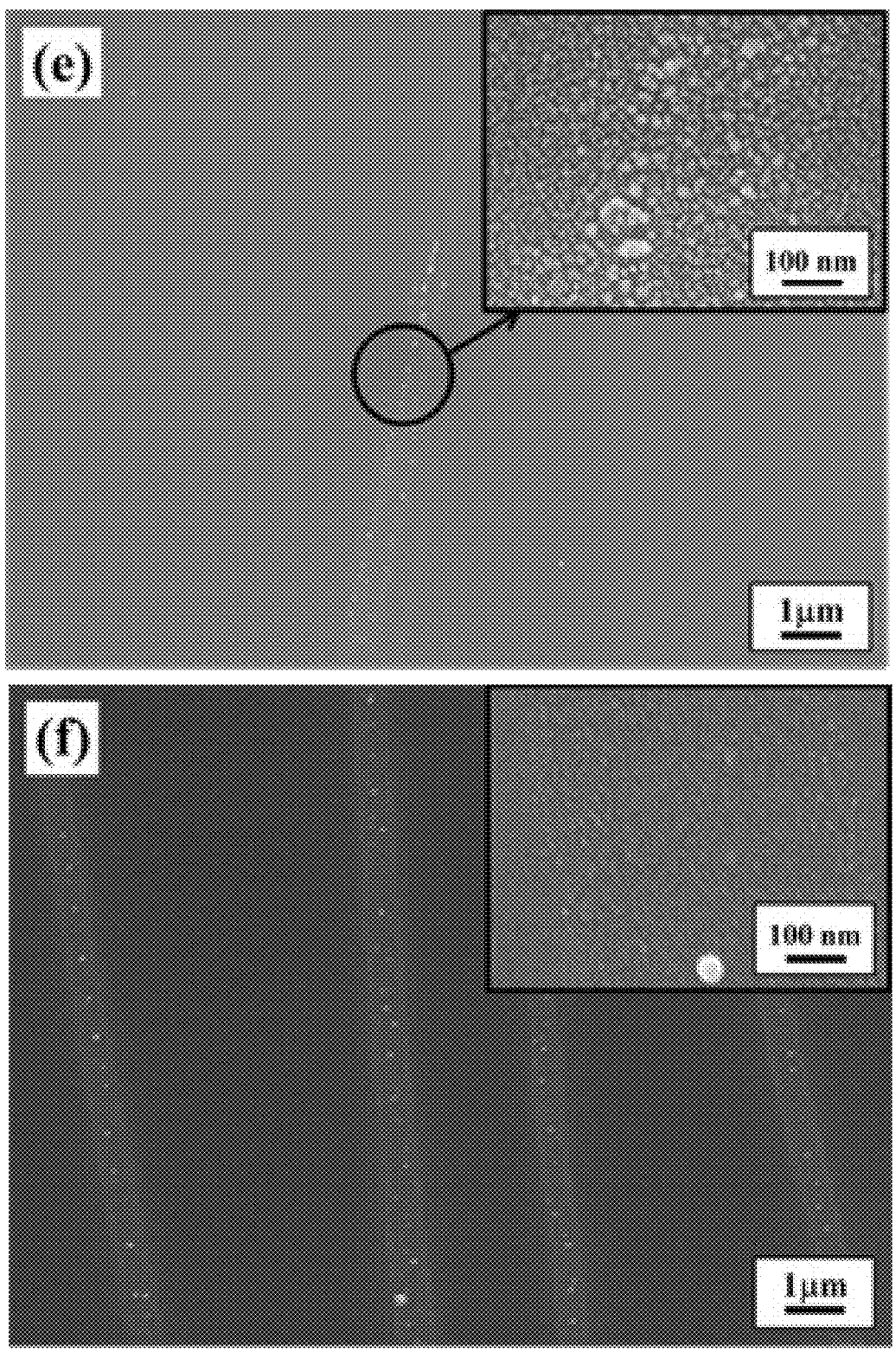

The as-spun AgF-1, AgF-2 and AgF-3 ES textiles with the average fiber diameters of 800, 350 and 285 nm, shown in FIGS. 2(a), 2(b) and 2(c), respectively, are smooth and uniform without Ag nanostructures on the surface. It indicates the PVP shell can completely cover the Ag-based core of nanofibers. It suggests that the present invention could control the diameter of nanofiber through the variation of the shell and core concentration. Note that the Ag theoretical values of in AgF-1, AgF-2 and AgF-3 are 1.39, 0.36 and 0.07% respectively.

Figure 3:
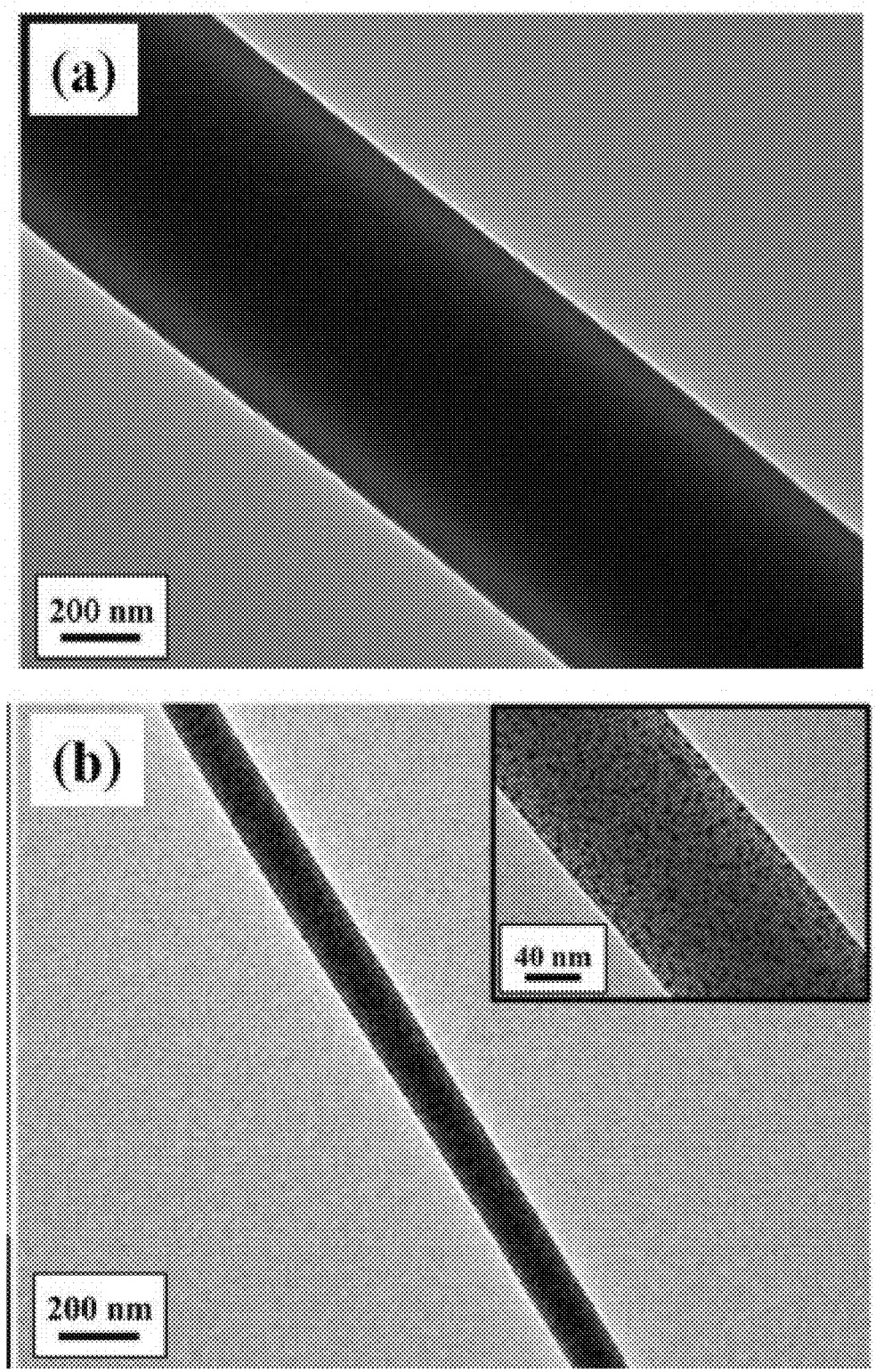
FIG. 3 Transmission electron microscope (TEM) images and selected-area electron diffraction (SAED) patterns of single AgF-1 (a, c), AgF-2 (e, f) and AgF-3 (b, d), respectively.
Figure 3:
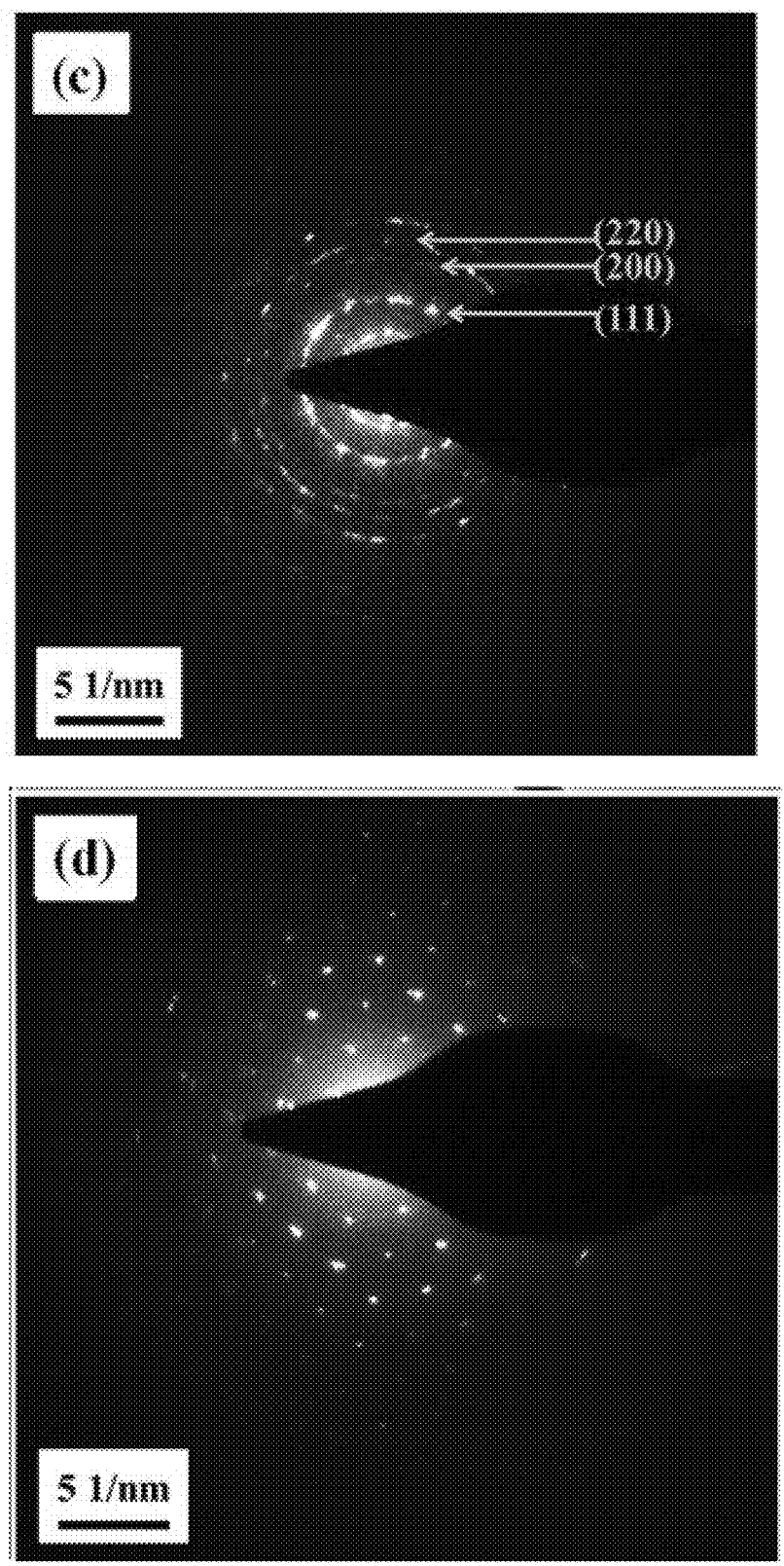
Figure 3:
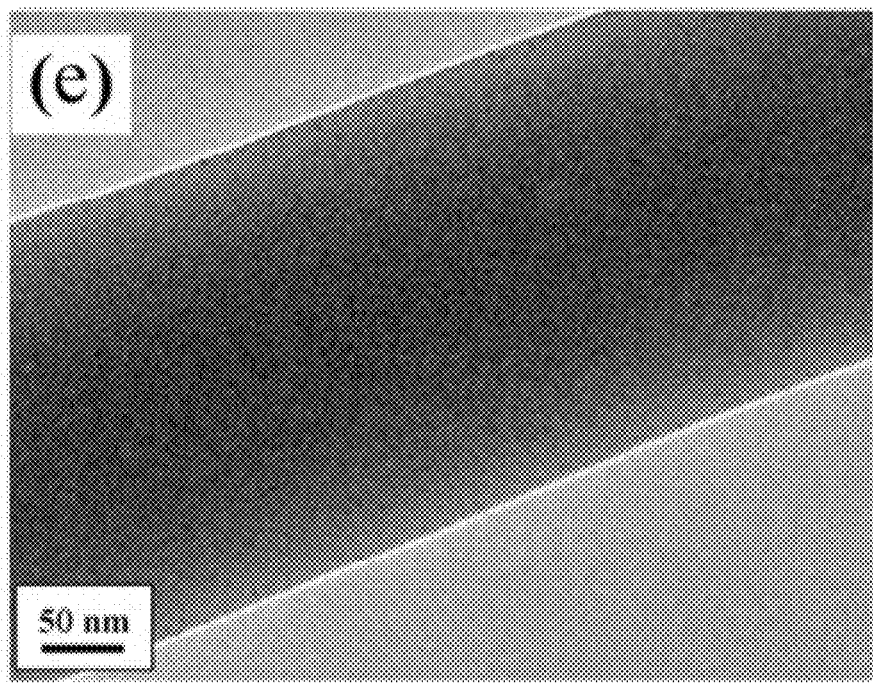
Figure 3:
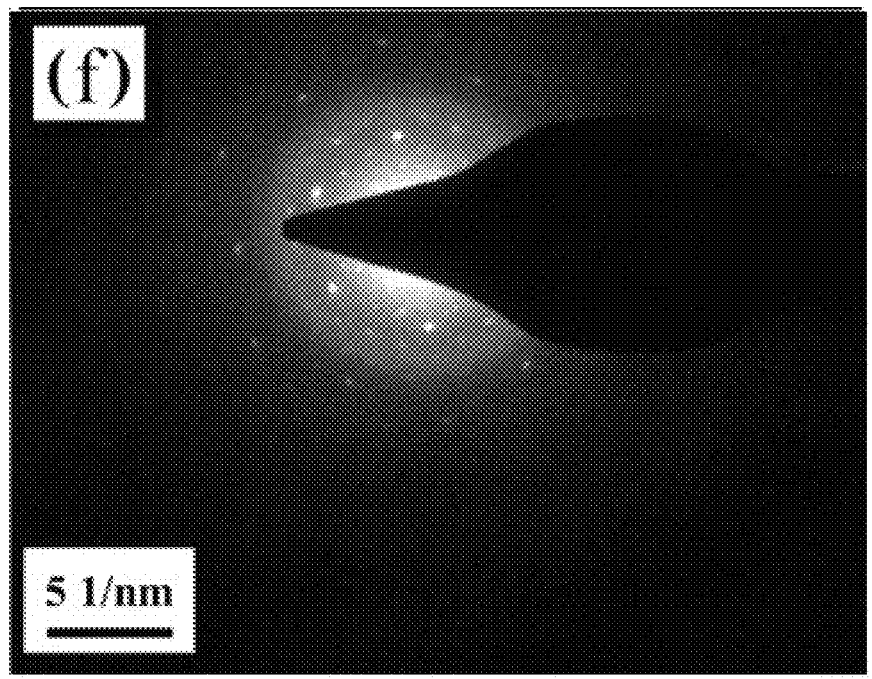

Also, in order to characterize the Ag nanostructures in the composite nanofibers, the PVP part was removed by vacuum calcination at 400° C. for 2 h, the FE-SEM images were shown in FIG. 2(d) AgF-1, 2(e) AgF-2 and 2(f) AgF-3. The Ag structure in AgF-1, AgF-2 and AgF-3 is spherical in shape with the average diameters of approximately 20 nm (FIG. 2(d)), 16 nm (FIG. 2(e)) and 5 nm (FIG. 2(f)), respectively. This result is consistent with the SPR signal of spherical Ag nanoparticles in the UV-visible spectrum of composite nanofibers, as discussed later. TEM images and SAED patterns of signal a,c) AgF-1, b,d) AgF-3 and e,f) AgF-2 shown in FIG. 3. To confirm the spherical morphology and the distribution of Ag nanostructures inside the fibers more directly, TEM and SAED analyses (FIG. 3) were performed. The Ag nanoparticles are well-dispersed in AgF-3 with an uniform size, as exhibited in FIG. 3b.

Nevertheless, TEM images of AgF-1 (FIG. 3(a)) only displays a full darkness result, which might be attributed to the large electron density of the Ag atom because of high concentration of Ag precursor within the ES process. On the other hand, the TEM image of AgF-2 shows scattered Ag nanoparticles in the edge and full darkness in the middle (FIG. 3(e)). It agrees with the trend of the core concentration on the TEM image. The orientation of Ag nanoparticles was recognized from the SAED patterns, which were obtained by directing the electron beam perpendicular to the studied nanofibers. From FIG. 3c, diffraction rings with different Ag packing structures is obtained from the SAED pattern of AgF-1. Compared to AgF-1, AgF-3 (FIG. 3(d)) shows the hexagonal symmetry of diffraction spots, indicating the Ag nanoparticles in AgF-3 are highly orientated with face-centered cubic crystalline structure. The smaller diameter of AgF-3 probably provides the severe geometrical confinement on the Ag growth and leads to the higher orientation than that of AgF-1. Similar orientation character is also presented in AgF-2 (FIG. 3(f)) with a relatively smaller fiber diameter compared to that of AgF-1. The relatively highly-orientated Ag nanoparticles in AgF-3 could result in higher charge carrier mobility for device applications.

Figure 4:
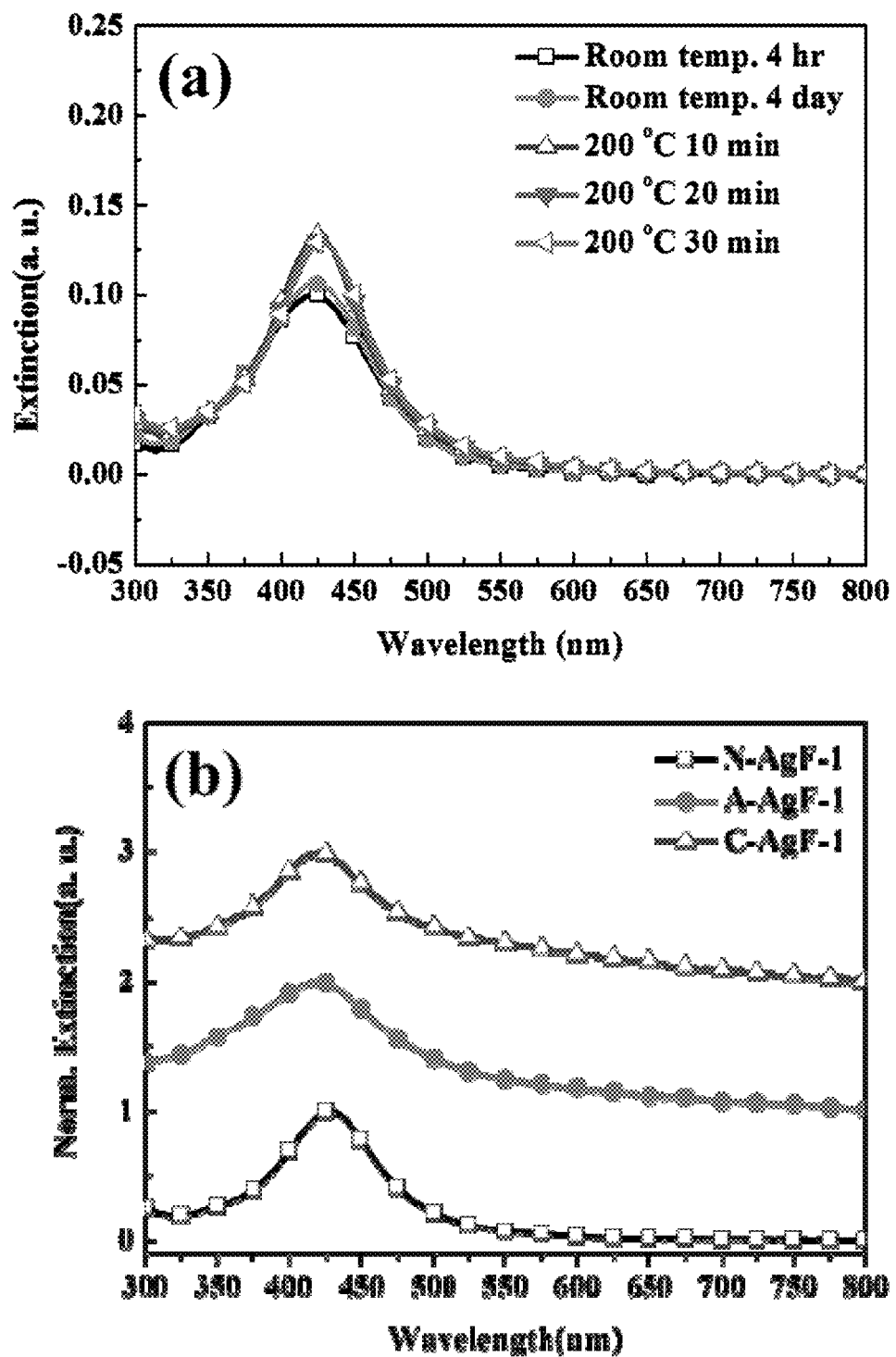
FIG. 4(a) Optical absorption spectra based on non-woven AgF-1; (b) Optical absorption spectra of AgF-1 in various patterns; optical absorption spectra based on non-woven ES nanofibers: (c) AgF-2, (d) AgF-3 and (e) comparative example 1.
Figure 4:
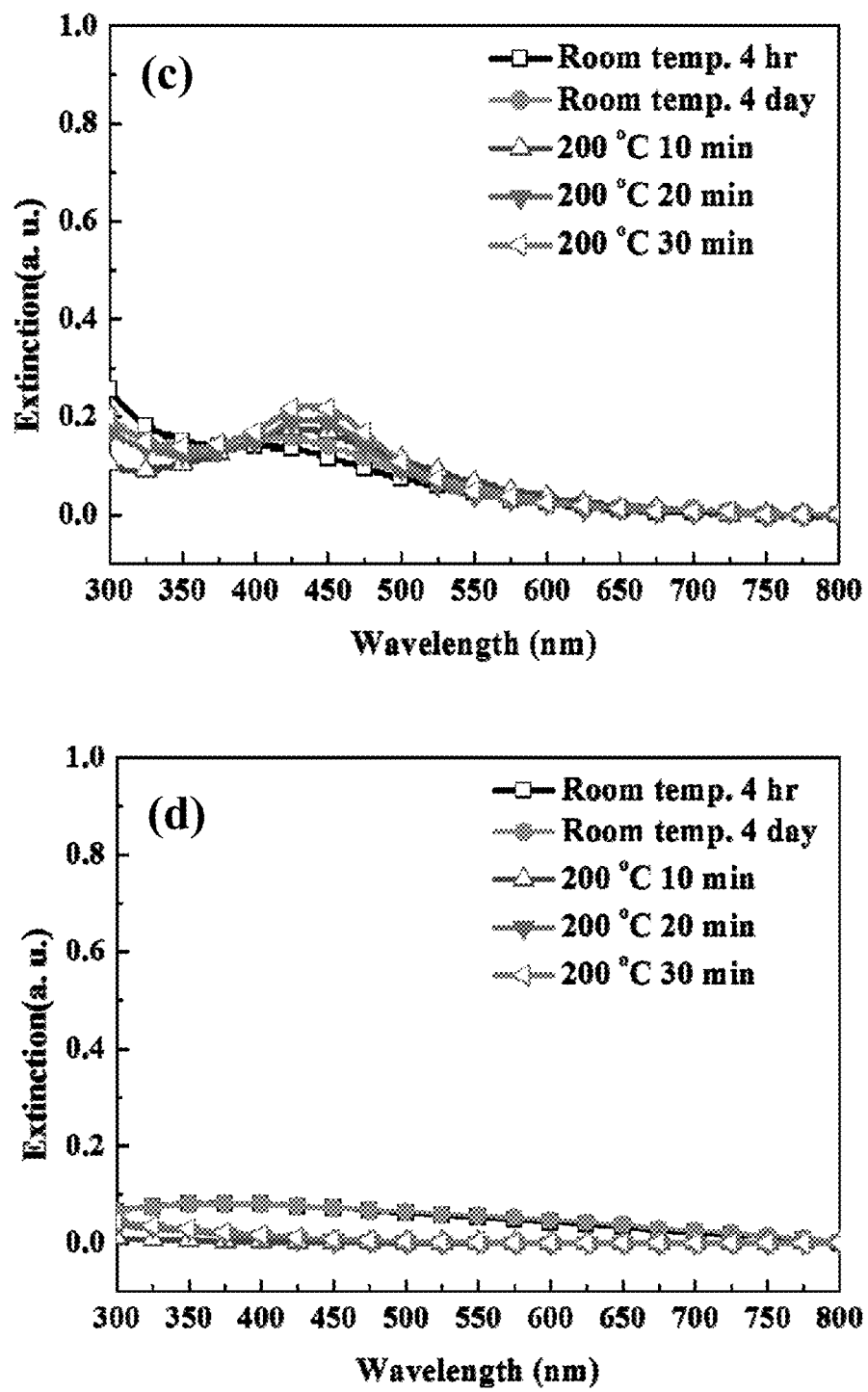
Figure 4:
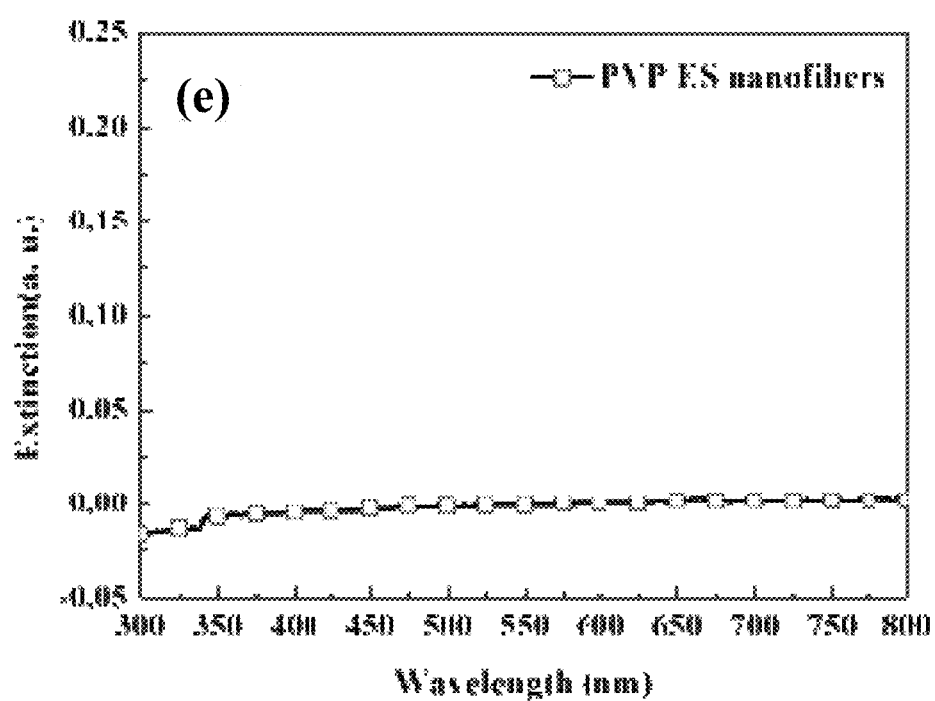

Moreover, optical absorption spectra based on non-woven AgF-1 was shown in FIG. 4(a). Optical absorption spectra of AgF-1 using various fiber patterns was shown in FIG. 4(b). To track the Ag reduction as well as morphological evolution in the Ag/PVP textiles, UV-visible absorption spectra are performed since different shapes of Ag nanostructures exhibit SPR bands at variant frequencies. As shown in FIG. 4a, the conspicuous SPR peak at 425 nm indicates the existence of Ag nanoparticles in AgF-1, even though the as-spun nanofibers are stored under room temperature. As shown in the figure, a red-shifted and stronger SPR signal (ca. 427 nm) is observed after 4 days under ambient environment without thermal treatment, demonstrating the continuous growth of Ag nanoparticles. The intensity of SPR signal of AgF-1 nanofibers annealed at 200° C. abruptly increases and slightly red-shifted to 431 nm, showing more Ag ions are reduced and the Ag nanoparticles have kept growing with increased annealing time. It indicates the Ag nanoparticles embedded plasmonic ES nanofibers can be directly manufactured via thermal treatment. In addition, the temporal optical absorption spectra based on the non-woven, AgF-2 was shown in FIG. 4(c). FIG. 4(d) shows about the temporal optical absorption spectra based on the non-woven AgF-3. Besides, as shown in FIG. 4c, the temporal optical absorption spectra based on the non-woven AgF-2 have the same tendency. However, no obvious signal in the UV-visible spectra of AgF-3 (FIG. 4(d)) is observed due to the extremely low Ag concentration. Note that the optical absorption spectrum of the parent PVP ES nanofibers (FIG. 4(d)) exhibits no characteristic peak in the same wavelength range, suggesting the effect of Ag nanoparticle. The abundant nitrogen atoms of PVP are not only employed to coordinate with Ag, but also create Ag network in the Ag/PVP composite nanofibers. Therefore, the composited nanofibers exhibit an excellent physical property to resist water or even other organic solvent. The SPR signals are almost the same in different fiber architectures, as shown in FIG. 4b, indicating the similar SPR effect.

Figure 5:
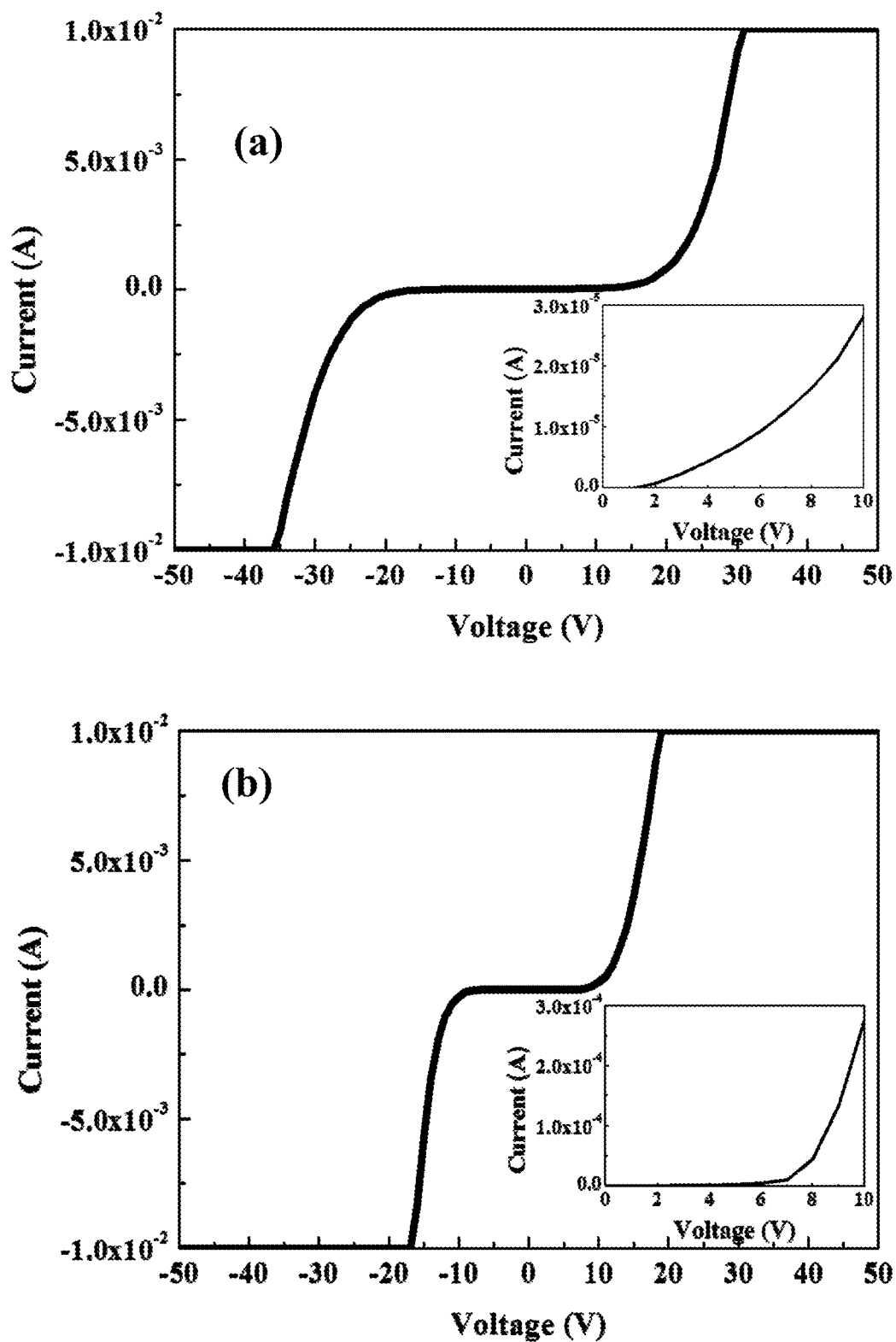
FIG. 5(a) the electrical characterizations of AgF-3 where the nonlinear I-V curve at the lower bias shown in the inset figures is probably resulted from the inter-grain boundary of Ag nanoparticles or the PVP component blocks the electron transportation in a low voltage bias; (b) characteristics of AgF-1 (c) I-V characteristics of AgF-2; (d) the comparison chart showing the effect on the conductivity of different shell liquid.
Figure 5:
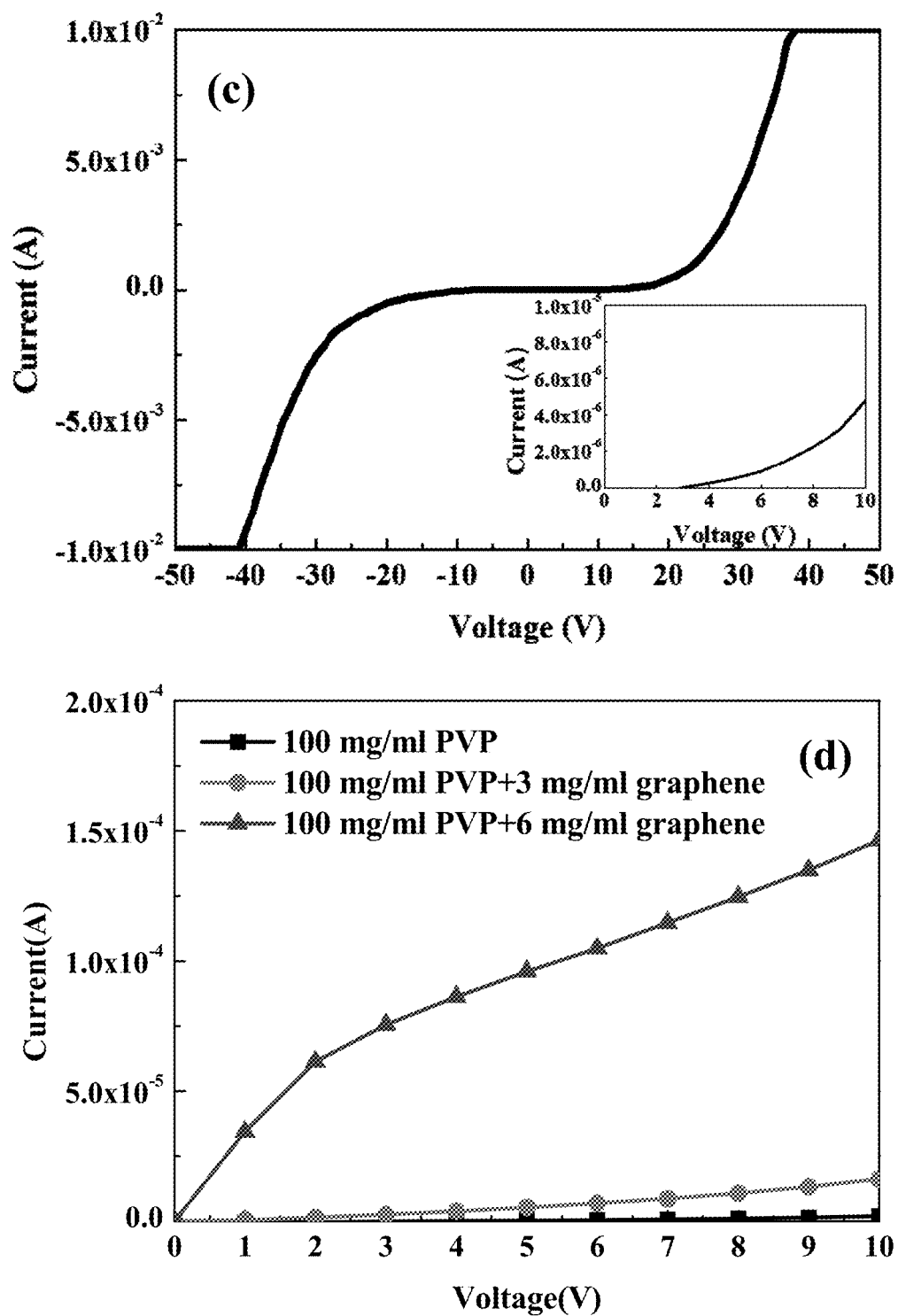

Electrical properties of electrospun nanofibers were described as follows. The electrical characteristics of the AgF-1(example 1) to AgF-3 (example 3), AgF-5 (example 5) and AgF-6 (example 6) composite nanofibers were performed using two-terminal electrical measurements with the Au electrodes. FIG. 5(a) is the electrical characterizations of AgF-3 where the nonlinear I-V curve at the lower bias shown in the inset figures is probably resulted from the inter-grain boundary of Ag nanoparticles or the PVP component blocks the electron transportation in a low voltage bias; additionally, at a higher bias, the nanofiber becomes conductive. Moreover, the I-V characteristics of AgF-1 shown in FIG. 5(b), the I-V characteristics of AgF-2 shown in FIG. 5(c), the I-V characteristics of comparative example 1, example 5 (AgF-5), example 6 (AgF-6) shown in FIG. 5(d). In the case of AgF-1 and AgF-2, the I-V curves also display the similar characteristic (FIG. 5(b), 5(c), respectively). The calculated conductivities of AgF-1, AgF-2 and AgF-3 are $1.20\times10^4$ S m$^{-1}$, $3.81\times10^5$ S m$^{-1}$ and $5.60\times10^5$ S m$^{-1}$, respectively. AgF-3 achieves the highest conductivity among the three Ag/PVP composite nanofibers, which mainly owing to the higher degrees of Ag nanoparticle crystalline orientation, as evidenced from the SAED results. In addiction, the conductive graphene was introduced, calculated by FIG. 5(d), the conductivities of AgF-6 achieves the conductivity to $6.4\times10^5$ S m$^{-1}$, higher than AgF-3.

Figure 6:
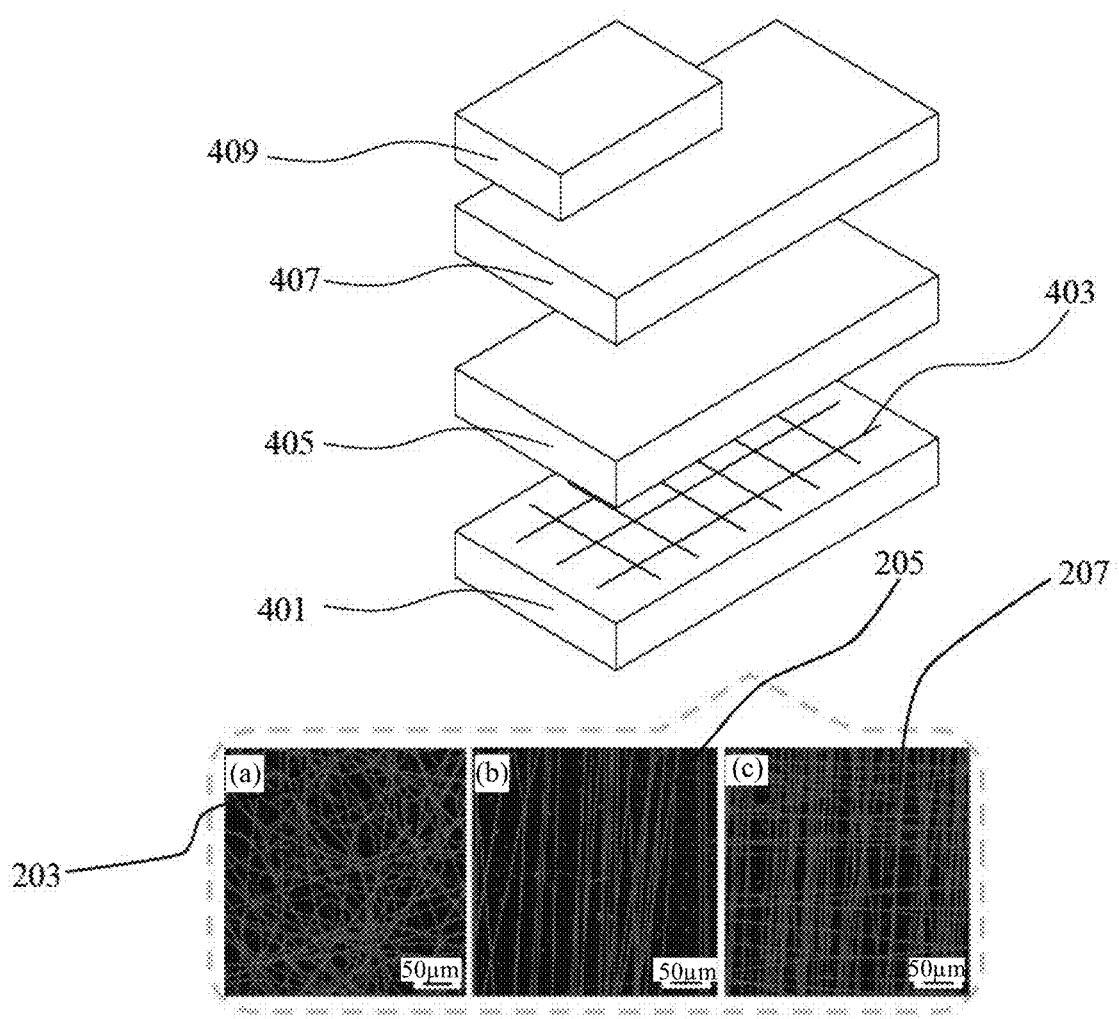
FIG. 6 Device structure of OPV cells and confocal images of AgF-3 with (a) non-woven, (b) aligned-, and (c) crossed-patterns.

Confocal images of the Ag/PVP ES nanofibers were described as follows. ES is a versatile assembly method for fabricating uniform and ultrafine nanofibers with different patterning via various geometric collectors, for example: non-woven or uniaxially aligned arrangements. For the studied Ag/PVP plasmonic nanofibers, the macroscopic distribution of Ag nanoparticles could be extracted from the confocal images based on the photoluminescence character of Ag. FIG. 6 shows the confocal images of AgF-3 and the structure of OPV devices, the images reveal different patterns of fibers, including non-woven 203, uniaxially parallel 205, and crossed pattern 207, as shown in FIGS. 6(a), (b), and (c), respectively. Although, FIG. 6 are black and white pattern, there emit a blue color within the entire composite nanofibers, implying the Ag nanoparticles are well-dispersed, indeed, the images reveal different patterns of fibers, including non-woven mats, uniaxially parallel array, and biaxially crossed pattern, as shown in FIGS. 6(a), (b), and (c), respectively.

Organic photovoltaic (OPV) device characteristics with Ag/PVP Nanofibers are described as follows. Herein, the different patterned Ag/PVP ES nanofibers are incorporated into the OPV devices with the sandwich configuration of ITO 401/composite nanofibers 403/PEDOT:PSS 405/P3HT:PC$_{61}$BM 407/Ca/Al, as shown in FIG. 6, for investigating the effect of ES plasmonic nanofibers on OPV performance.

Figure 7:
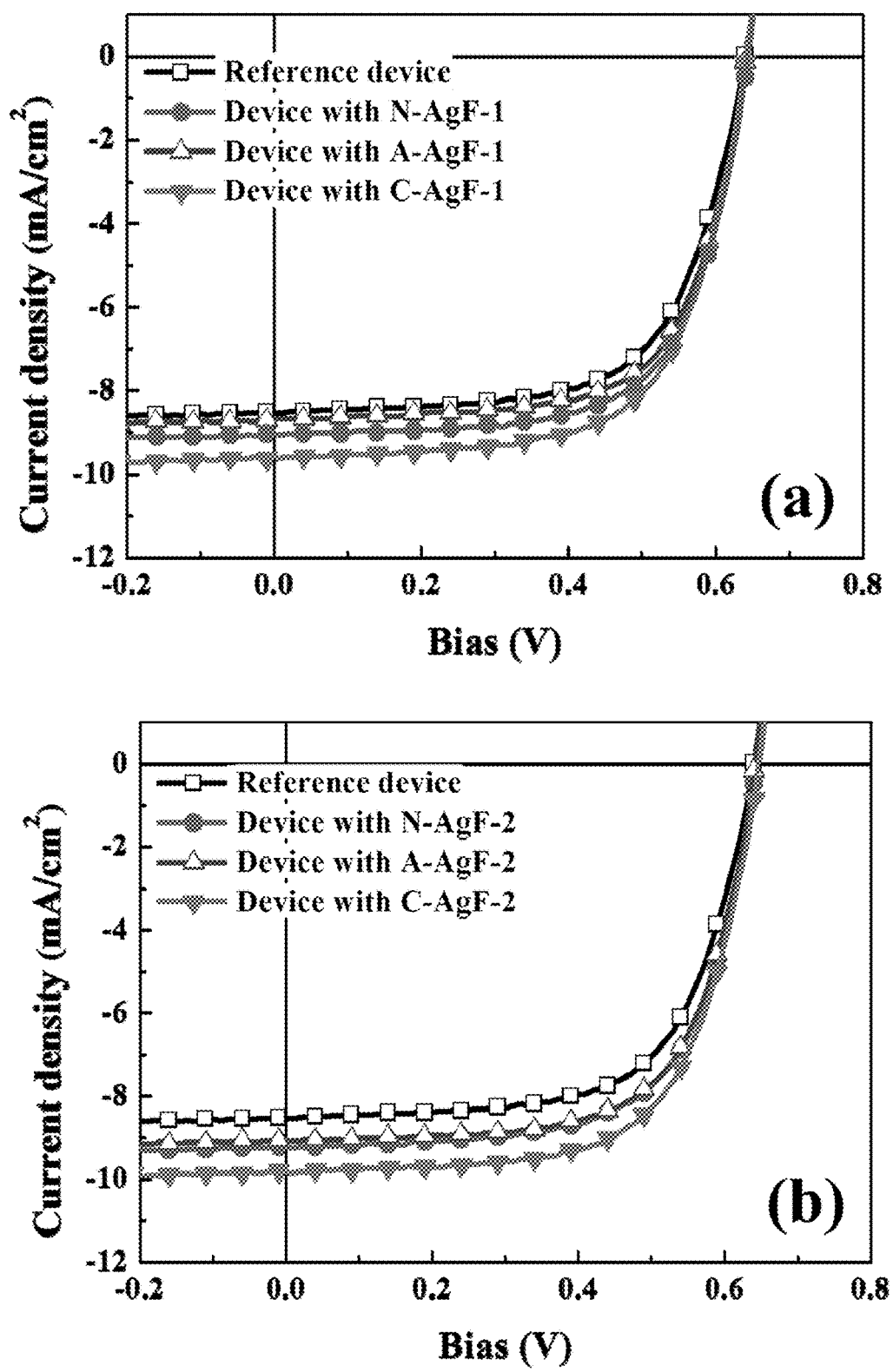
FIG. 7 J-V characteristics of P3HT:$PC_{61}BM$ OPV reference device, and devices with non-woven-, aligned-, and cross-patterned Ag/PVP ES nanofibers prepared from (a) AgF-1, (b) AgF-2, (b) AgF-3 and (d) non-woven PVP nanofiber (comparative example 1).
Figure 7:
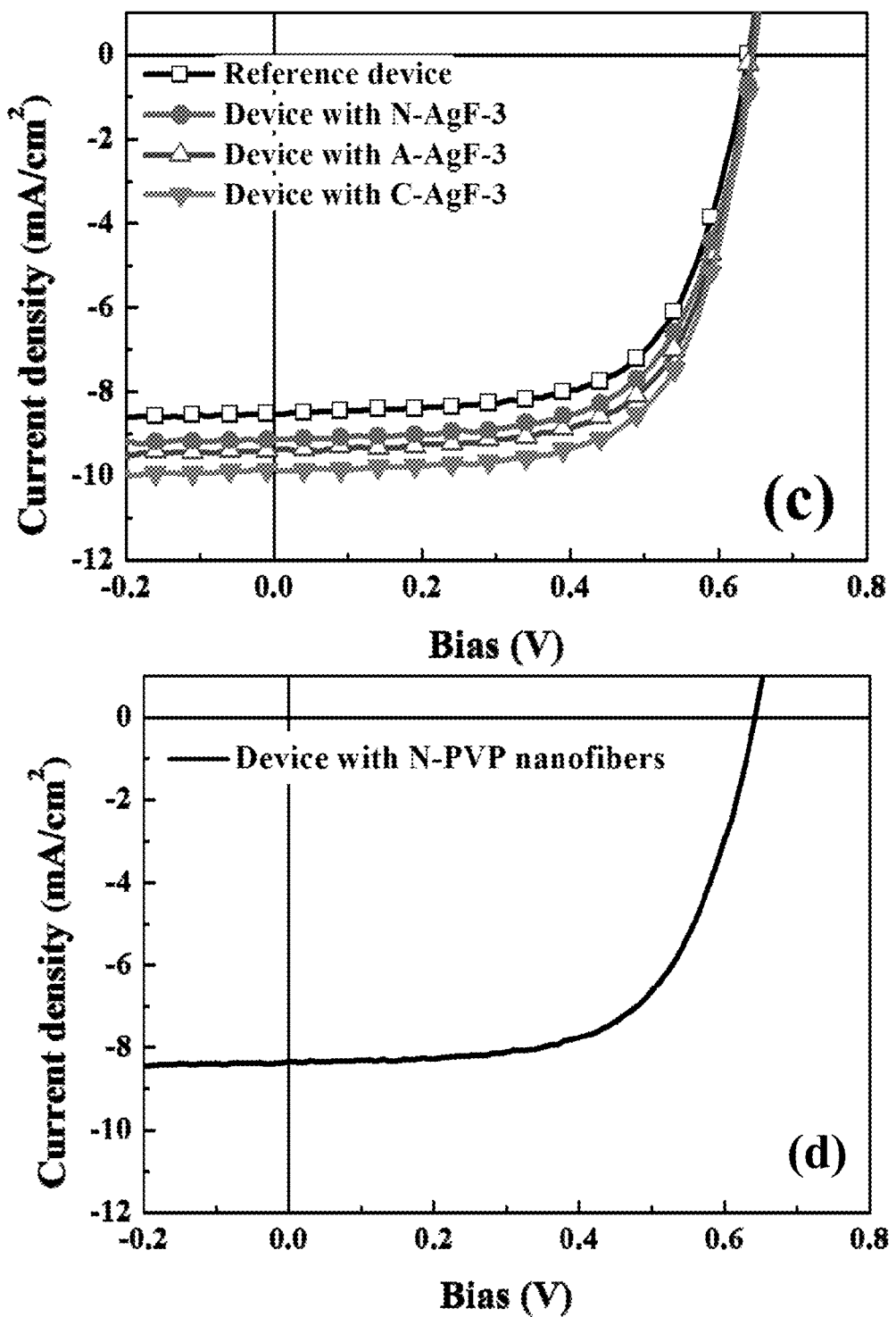

The corresponding current density (J)-voltage (V) characteristics of OPV devices of non-woven (N), aligned (A), and crossed (C) pattered AgF-1 (shown in FIG. 7(a)), AgF-2 (shown in FIG. 7(b)), AgF-3 (shown in FIG. 7(c)) and comparative example 2 (shown in FIG. 7(d)). Besides, the corresponding current density (J)-voltage (V) characteristics of the devices with or without the P3HT:PCBM composite nanofibers are summarized in Table 1, wherein the average value of PCE is calculated from at least 10 devices, $R_S$ is derived from the slope of the J-V curves at 1 V, and the reference device is the device without ES nanofibers (comparative example 2). The abbreviations of N-, A- and C- are the ES nanofibers with the architectures of non-woven, aligned-, and crossed-patterns. All of the photovoltaic cells were measured at one sun intensity (100 mW cm$^{-2}$) under simulated AM 1.5G illumination. The controlled cell without the Ag/PVP nanofibers reaches a PCE of 3.53% with the open circuit voltage ($V_{oc}$) of 0.64 V, short circuit current ($J_{sc}$) of 8.54 mA cm$^{-2}$, and fill factor (FF) of 0.646 in comparative example 2. The AgF-1 non-woven, aligned, and crossed ES nanofibers layer are introduced into the OPV cells and named as N-AgF-1, A-AgF-1, and C-AgF-1, respectively. The PCEs show obvious improvement from 3.53% (the reference cell, comparative example 2) to 3.87% (N-AgF-1), 3.73% (A-AgF-1), and 4.03% (C-AgF-1) with the $J_{sc}$ values of 9.06, 8.68, and 9.63 mA cm$^{-2}$, respectively. Besides, after incorporating higher conductive AgF-2, the PCEs of N-AgF-2, A-AgF-2, and C-AgF-2 improve to 3.88, 3.86, and 4.14% with the $J_{sc}$ values of 9.22, 9.08 and 9.83 mA cm$^{-2}$, respectively. Furthermore, the OPVs with the highly conductive AgF-3 exhibit the PCEs of 3.77, 3.97 and 4.19% with the $J_{sc}$ values of 9.13, 9.39, and 9.87 mA cm$^{-2}$ for N-AgF-3, A-AgF-3, and C-AgF-3, respectively. Note that the $V_{oc}$ (generally 0.65 V) and FF (in a range of 0.63 to 0.66) of all nanofibers-containing OPVs show an insignificant difference. Thus, the increase of PCEs is mainly attributed to the improvement of $J_{sc}$ from the conductive nanofibers. Furthermore, J-V characteristic of P3HT:PC61BM OPV device with non-woven PVP nanofibers (comparative example 1) exhibits a $J_{sc}$ of 8.35 mA cm$^{-2}$, an $V_{oc}$ of 0.65 V, a FF of 0.617 and a PCE of 3.35%. In addition, the performance of device embedded with non-woven pure PVP ES nanofibers (comparative example 1) is slightly inferior compared to that of the controlled cell (FIG. 7(d)). It indicates the presence of Ag nanoparticles in composite nanofiber is the main fact to improve the performance of OPVs.

TABLE 1

| Device | $V_{oc}$ (V) | $J_{sc}$ (mA cm$^{-2}$) | FF (—) | PCE[a] (%) | Rs[b] (Ω cm$^2$) |
|---|---|---|---|---|---|
| Reference[c] | 0.64 | 8.54 ± 0.04 | 0.646 ± 0.005 | 3.53 ± 0.03 | 14.77 |
| N—AgF-1 | 0.65 | 9.06 ± 0.09 | 0.657 ± 0.001 | 3.87 ± 0.04 | 13.89 |
| A—AgF-1 | 0.65 | 8.68 ± 0.06 | 0.660 ± 0.001 | 3.73 ± 0.02 | 14.29 |
| C—AgF-1 | 0.65 | 9.63 ± 0.07 | 0.644 ± 0.003 | 4.03 ± 0.03 | 13.12 |
| N—AgF-2 | 0.65 | 9.22 ± 0.05 | 0.648 ± 0.007 | 3.88 ± 0.05 | 12.52 |
| A—AgF-2 | 0.65 | 9.08 ± 0.03 | 0.654 ± 0.002 | 3.86 ± 0.07 | 13.73 |
| C—AgF-2 | 0.65 | 9.83 ± 0.06 | 0.648 ± 0.005 | 4.14 ± 0.02 | 12.51 |
| N—AgF-3 | 0.65 | 9.13 ± 0.08 | 0.636 ± 0.021 | 3.77 ± 0.09 | 13.84 |
| A—AgF-3 | 0.65 | 9.39 ± 0.05 | 0.651 ± 0.002 | 3.97 ± 0.03 | 13.45 |
| C—AgF-3 | 0.65 | 9.87 ± 0.02 | 0.653 ± 0.007 | 4.19 ± 0.03 | 12.29 |

Table 2 show the J-V characteristics of OPV devices of composite nanofiber AgF-4, only $PF_{99}BT_{01}$ nanofiber (comparative example 3) or Ag nanofiber (comparative example 4) introduced OPV devices, respectively.

TABLE 2

| devices | $V_{oc}$ (V) | $J_{sc}$ (mA cm$^{-2}$) | FF (—) | Efficiency (%) |
|---|---|---|---|---|
| $PF_{99}BT_{01}$ | 0.63 | −9.04 | 0.69 | 3.94 |
| Ag | 0.63 | −8.82 | 0.69 | 3.84 |
| Ag + $PF_{99}BT_{01}$ | 0.63 | −9.44 | 0.69 | 4.11 |

Figure 8:
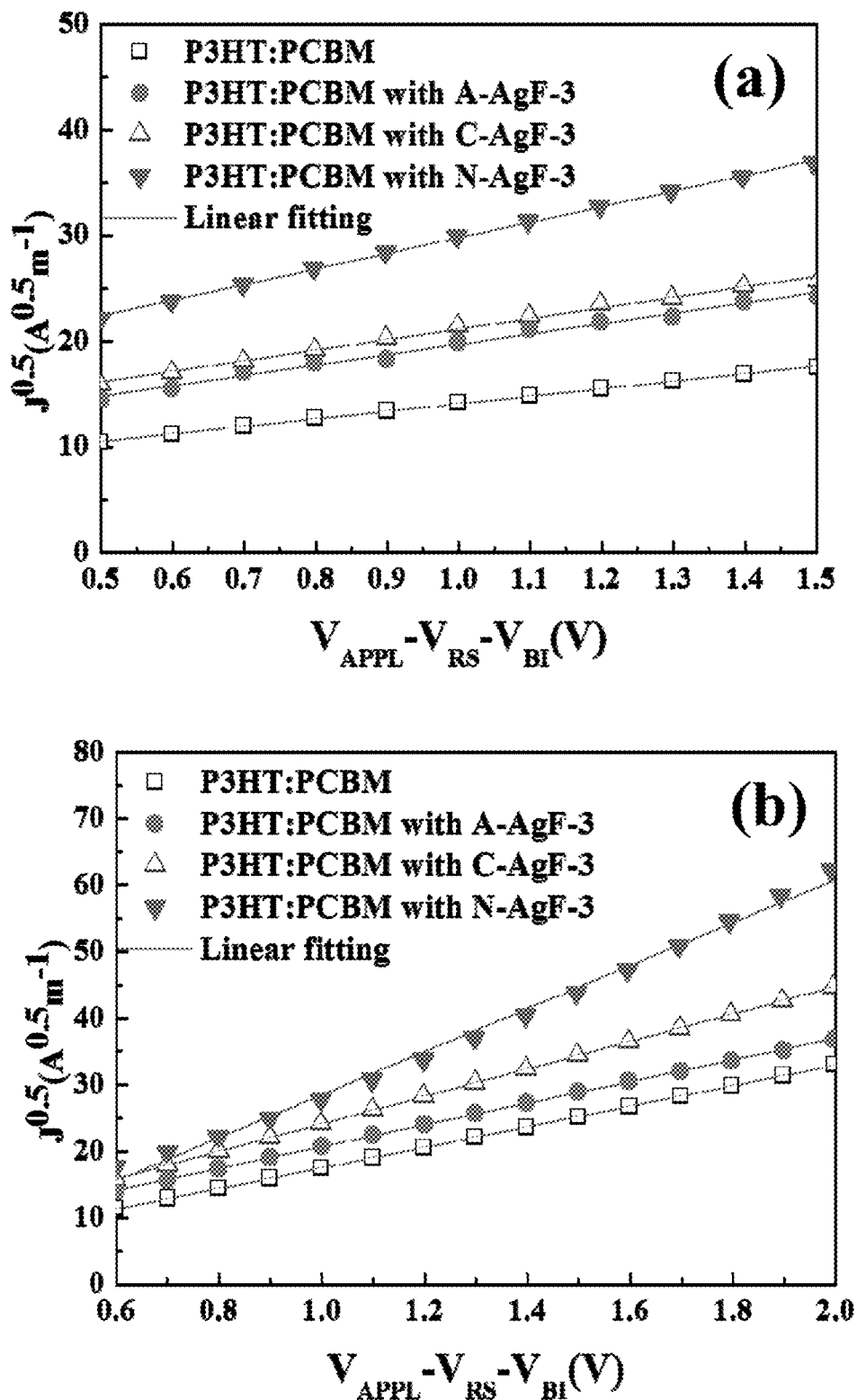
FIG. 8 Measured $J^{0.5}$-V characteristics under dark for (a) hole-only and (b) electron-only devices. The bias is corrected for built-in voltage $V_{BI}$, arising from difference in the work function of the contacts, and the voltage drop due to substrate series resistance, such that $V=V_{APPL}-V_{RS}-V_{BI}$. The solid lines represent the fitting curves.

The enlargements of PCE and $J_{sc}$ value are particularly owing to the enhancements of charge carrier mobility and the rate of exciton formation from the Ag/PVP plasmonic nanofibers. Since the charge transporting ability is essential for achieving high efficient OPV device, the space-charge-limited-current (SCLC) method was explored to elucidate the relationship between Ag/PVP ES nanofibers and hole or electron mobilities. FIG. 8 shows the measured $J^{0.5}$-V characteristics under dark for (a) hole-only and (b) electron-only devices. The bias is corrected for built-in voltage $V_{BI}$, arising from difference in the work function of the contacts, and the voltage drop due to substrate series resistance, such that $V=V_{APPL}-V_{RS}-V_{BI}$. The solid lines represent the fitting curves. FIGS. 8(a) and (b) show the $J^{0.5}$-V curves of the hole-only and electron-only devices, respectively, with non-woven, aligned, and crossed AgF-3. The hole mobilities of the reference cell, aligned, crossed and non-woven AgF-3 nanofibers-based device are 1.51×10$^{-4}$, 2.92×10$^{-4}$, 3.51×10$^{-4}$, and 6.50×10$^{-4}$ cm$^2$ V$^{-1}$ s$^{-1}$, respectively, while the electron mobilities are 4.36×10$^{-4}$, 5.17×10$^{-4}$, 8.04×10$^{-4}$ and 2.16×10$^{-3}$ cm$^2$ V$^{-1}$ s$^{-1}$. The above results indicate the incorporation of Ag/PVP ES nanofibers in P3HT:PC61BM OPV system can not only improve the charge drift velocity, but also further reduce in electrical resistance, especially for the composite nanofibers with fused joints (i.e. non-woven and crossed-patterns). Thus, the OPVs with the cross-patterned Ag/PVP nanofibers exhibit the largest improvement in $J_{sc}$ as well as PCE and decrease in electrical resistance as compared to that of align-patterned nanofibers-based devices. The optimal PCE of photovoltaic devices with cross-patterned AgF-1, AgF-2 and AgF-3 nanofibers exhibit a PCE of 4.03, 4.14 and 4.19%, which are 14.2 17.3 and 18.7% improvement, respectively, compared to the reference device (PCE=3.53%) without composite nanofibers. Although the non-woven nanofibers possess large amount of fused joints, the randomly distributed nanofiber networks probably provides a large surface roughness and forms trapping sites for the poorer PCE, compared to that of the cross-patterned nanofibers.

Figure 9:
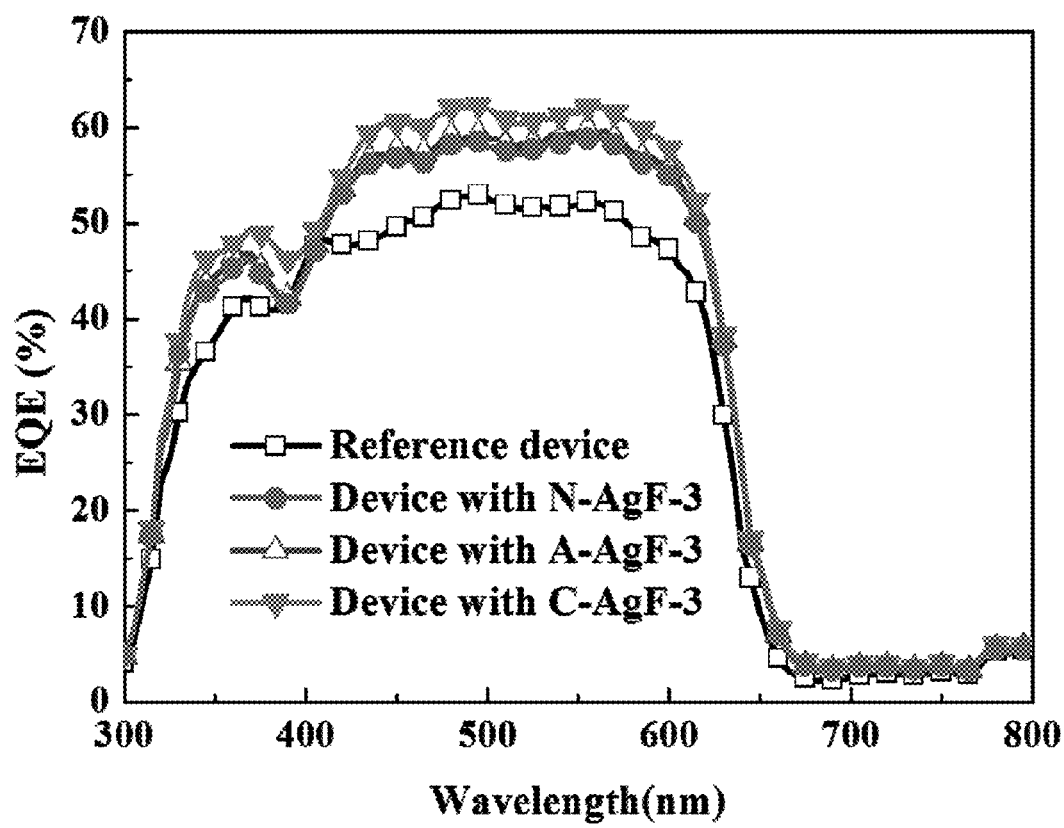
FIG. 9, EQE (External Quantum Efficiency) measurements of all OPV devices with or without the Ag/PVP nanofibers for investigating the SPR effects of Ag/PVP ES nanofibers.

FIG. 9 shows the EQE measurements of all OPV devices with or without the Ag/PVP nanofibers and the EQE results of the studied OPV devices for investigating the SPR effect of Ag/PVP ES nanofibers. The EQEs for all OPVs are increased after employing the Ag/PVP nanofibers with covered a wide-range wavelength from 300 to 800 nm. Furthermore, the integrated photocurrent densities from the EQE spectrum of the reference, N-AgF-3, A-AgF-3, and C-AgF-3 are 8.40, 9.12, 9.24, and 9.65 mA cm$^{-2}$, respectively. The enhancement is a consequence of the improved charge carrier mobility and the exciton generation rate due to the SPR effect from the studied ES nanofibers. All the integrated current density values are in a good agreement with the measured photocurrent densities (within 5% error), indicating that the photovoltaic results are reliable. The above results demonstrate that the Ag/PVP plasmonic nanofibers are a promising candidate for enhancing the OPV performance.

Figure 10:
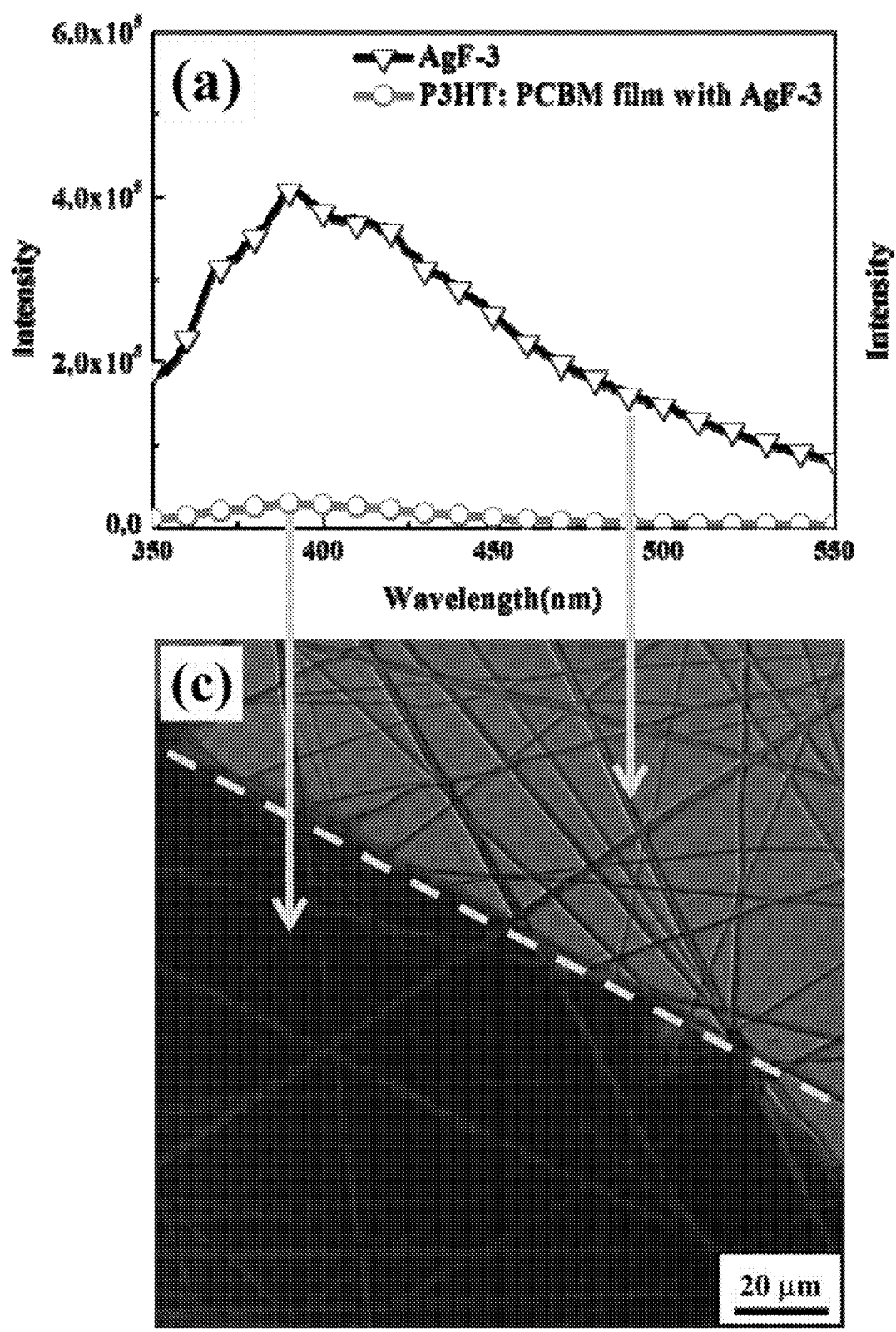
FIG. 10 (a) PL spectra of AgF-3 before and after spin-coating P3HT:$PC_{61}BM$ film. (b) PL spectra of P3HT:$PC_{61}BM$ layer before and after incorporating AgF-3. (c) Confocal image of AgF-3 and spin-coated P3HT:$PC_{61}BM$ film with collected emission bandwidth from 470 nm to 550 nm. (d) Confocal image of AgF-3 and spin-coated P3HT:$PC_{61}BM$ film with collected emission bandwidth from 550 nm to 790 nm.
Figure 10:
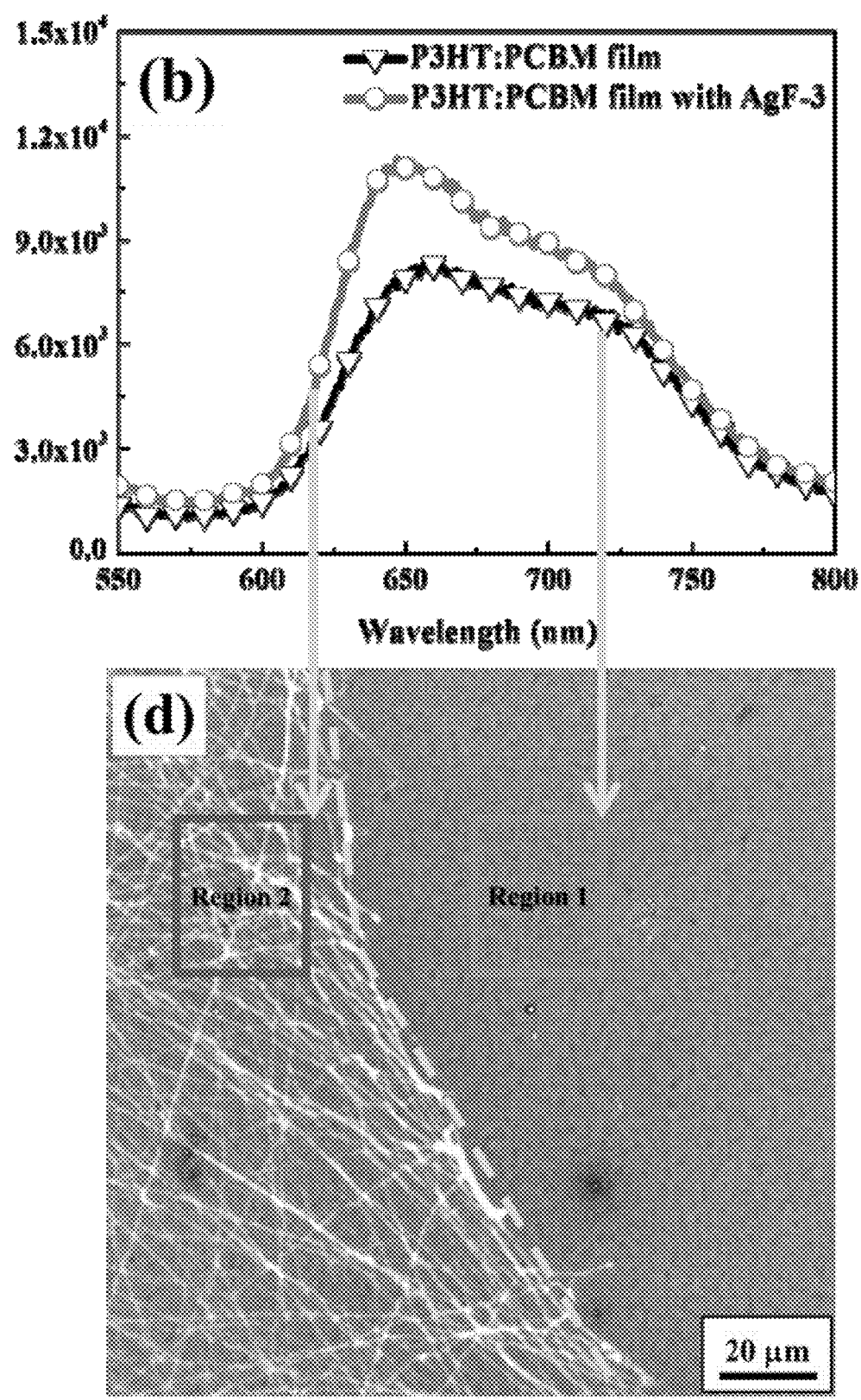

Radiative energy transfer from plasmonic Ag/PVP nanofibers to photo-active layer are described as follows. The luminescence of the Ag metal was first observed by Mooradian, which was generally attributed to electronic transitions between the upper d orbital and conduction sp band. The Ag luminescence can be induced by irradiating the metal surface or film with the emission source in a range of 320-520 nm. FIG. 10(a) shows PL spectra of AgF-3 before and after spin-coating P3HT:PC$_{61}$BM film. FIG. 10(b) shows PL spectra of P3HT:PC$_{61}$BM layer before and after incorporating AgF-3. FIG. 10(c) shows confocal image of AgF-3 and spin-coated P3HT:PC$_{61}$BM film with collected emission bandwidth from 470 nm to 550 nm. FIG. 10(d) shows confocal image of AgF-3 and spin-coated P3HT:PC$_{61}$BM film with collected emission bandwidth from 550 nm to 790 nm. The photoluminescence (PL) spectra were explored to investigate the interaction between the Ag/PVP ES nanofibers and P3HT:PC61BM photo-active layer. Pure AgF-3 shows a clear emission peak at 390 nm with a 325 nm photoexcitation power signal. However, the PL intensity of the composite nanofibers with the P3HT:PC61BM layer is abruptly quenched almost 90%. On the other hand, the emission signal of P3HT:PC61BM film (ca. 550-800 nm) after incorporating the AgF-3 is enhanced, as shown in FIG. 10(b). The significant changes on the PL intensity of Ag/PVP nanofibers and P3HT:PC61BM film suggests the energy transfer between the Ag and photo-active layer. This energy transfer effect could be further confirmed by confocal images, as depicted in FIGS. 10(c) and 10(d). There are two parts in the confocal image of FIG. 10(c): pristine AgF-3 nanofibers (top right side) and AgF-3 embedded in P3HT: PC61BM film (bottom left side). It could be clearly observed that the PL intensity of AgF-3 is sharply quenched after incorporating the photo-active film. FIG. 10(d) shows the confocal images of pure P3HT:PC61BM region (top right side, region 1) and composite area of P3HT:PC61BM with AgF-3 (bottom left side, region 2). The mean PL intensity of regions 1 and 2 is 54.62 and 72.09 a.u., respectively, demonstrating that the emission in photoexcitation intensity of P3HT is enhanced after incorporating the Ag/PVP nanofibers. It should be known that radiative energy transfer from the metal SPR to the semiconductor can take place through near-field electromagnetic and resonant photon-scattering mechanisms. Therefore, the PL change is attributed to the fact that radiative energy transfer from excited plasmonic Ag nanoparticles to the nearby photo-active P3HT, and then increase in P3HT PL emission. The above result demonstrates the enhancement on the PCE of the P3HT:PC61BM photovoltaic cells through the plasmonic ES nanofibers.

Figure 11:
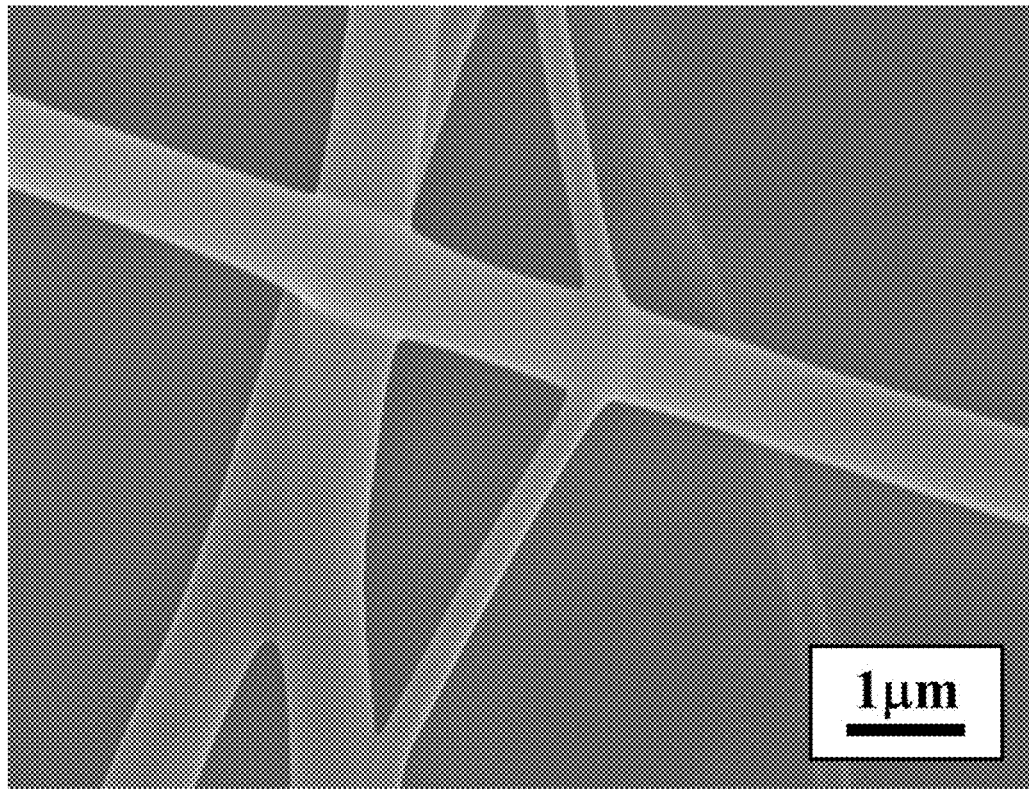
FIG. 11 shows FE-SEM image of the fused AgF-1 nanofibers after thermal annealing and water-etching.

Moreover, the fused crossed-junction of AgF-1 is confirmed by FE-SEM after thermal annealing (200° C. for 20 min) and water-etching (FIG. 11). It was reported that the melt junctions between nanowires or nanofibers would possess lower junction resistances, leading to the improvement of electrical conductivity. Thus, the prepared plasmonic nanofibers with the fused joint structure could provide enhanced charge carrier mobility for enhancing the OPV performance.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A photovoltaic device, comprising:
   a nanofiber layer, comprising one or more nanofibers, wherein the nanofiber comprising a core, which extends along an axis of the nanofiber and is composed of Ag nanoparticles and a shell, which extends along the axis of the nanofiber and wraps the core and composed of at least one selected from the group consisting of PVP, PMAA, PFBT PFTP, and PFQ, wherein one or more nanofibers has fused joints with each other;
   an ITO layer, which is set under the nanofiber layer;
   a PEDOT: PSS layer, which is set above the nanofiber layer;
   a P3HT: $PC_{61}BM$ layer, which is set above the PEDOT: PSS layer; and
   a Ca/Al layer, which is set above the P3HT: $PC_{61}BM$ layer.

2. The photovoltaic device of claim 1, wherein one or more nanofibers in the nanofiber layer are deposited in a non-woven pattern.

3. The photovoltaic device of claim 1, wherein one or more nanofibers in the nanofiber layer are deposited in a crossed-pattern.

4. The photovoltaic device of claim 1, wherein the shell further comprises sodium SDS and graphene.

5. The photovoltaic device of claim 1, wherein the shell further comprises TBAP.

* * * * *